United States Patent
Le Royer et al.

(10) Patent No.: US 12,389,644 B2
(45) Date of Patent: Aug. 12, 2025

(54) METHOD FOR MANUFACTURING A TRANSISTOR WITH A GATE-ALL-AROUND STRUCTURE

(71) Applicant: COMMISSARIAT À L'ENERGIE ATOMIQUE ET AUX ÉNERGIES ALTERNATIVES, Paris (FR)

(72) Inventors: Cyrille Le Royer, Grenoble (FR); Joël Kanyandekwe, Grenoble (FR); Sylvain Barraud, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 453 days.

(21) Appl. No.: 17/826,877

(22) Filed: May 27, 2022

(65) Prior Publication Data
US 2022/0384573 A1 Dec. 1, 2022

(30) Foreign Application Priority Data
May 27, 2021 (FR) .................................... 2105519

(51) Int. Cl.
*H01L 21/02* (2006.01)
*H10D 30/62* (2025.01)
(Continued)

(52) U.S. Cl.
CPC ..... *H10D 62/119* (2025.01); *H01L 21/02532* (2013.01); *H10D 30/62* (2025.01); *H10D 30/6735* (2025.01); *H10D 30/6757* (2025.01)

(58) Field of Classification Search
CPC ........... H01L 21/02532; H01L 29/0669; H01L 29/42392; H01L 29/785; H01L 29/78696;
(Continued)

(56) References Cited

U.S. PATENT DOCUMENTS 8,389,347 B2  3/2013  Tezuka et al.
8,969,148 B2  3/2015  Vinet et al.
(Continued)

FOREIGN PATENT DOCUMENTS

EP  1 868 232 B1  2/2009
EP  3127862 B1 *  4/2018  ............. B82Y 10/00
(Continued)

OTHER PUBLICATIONS

Search Report as issued in French Patent Application No. FR2105519, dated Feb. 9, 2022.
(Continued)

*Primary Examiner* — Zandra V Smith
*Assistant Examiner* — Douglas Yap
(74) *Attorney, Agent, or Firm* — Pillsbury Winthrop Shaw Pittman LLP

(57) ABSTRACT

A method for manufacturing a pFET transistor, the method for manufacturing the transistor including providing a base structure comprising a silicon channel and a gate structure, the gate structure surrounding the channel leaving two flanks of the channel free; growing a first layer made from silicon-germanium alloy on the flanks of the channel; enriching the channel with germanium atoms from the first layer; and forming a drain region and a source region on either side of the channel.

15 Claims, 30 Drawing Sheets

(51) Int. Cl.
*H10D 30/67* (2025.01)
*H10D 62/10* (2025.01)

(58) Field of Classification Search
CPC .............. H01L 29/0847; H01L 29/1054; H01L 29/161; H01L 29/66439; H01L 29/66795; H01L 29/775; H01L 29/0673; H01L 29/0676; H01L 29/0665; H01L 29/068; B82Y 10/00

See application file for complete search history.

(56) References Cited

U.S. PATENT DOCUMENTS

| | | |
|---|---|---|
| 10,079,181 B2 | 9/2018 | Chang et al. |
| 10,600,638 B2 | 3/2020 | Cheng et al. |
| 2006/0068553 A1* | 3/2006 | Thean ............... H01L 29/66787 257/E21.442 |
| 2015/0270349 A1* | 9/2015 | Cheng ................... H01L 29/785 438/154 |
| 2017/0125303 A1* | 5/2017 | Cheng ................. H01L 27/0924 |
| 2018/0175166 A1 | 6/2018 | Reboh et al. |
| 2018/0190545 A1* | 7/2018 | Bi ..................... H01L 29/78696 |
| 2020/0105617 A1* | 4/2020 | Wang .................. H01L 29/0847 |

FOREIGN PATENT DOCUMENTS

| | | |
|---|---|---|
| FR | 3 005 372 A1 | 11/2014 |
| FR | 3 043 837 A1 | 5/2017 |

OTHER PUBLICATIONS

Jan, C.H., et al., "A 22nm SoC Platform Technology Featuring 3-D Tri-Gate and High-k/Metal Gate, Optimized for Ultra Low Power, High Performance and High Density SoC Applications," IEEE, Logic Technology Development, Intel Corporation, (2012), 4 pages.

Morin, P., et al., "A review of the mechanical stressors efficiency applied to the ultra-thin body & buried oxide fully depleted silicon on insulator technology," Solid-State Electronics, (2015), 17 pages.

Gupta, S., et al., "7-nm FinFET CMOS Design Enabled by Stress Engineering Using Si, Ge, and Sn," IEEE Transactions on Electron Devices, vol. 61, No. 5, May 2014, pp. 1222-1230.

* cited by examiner

[Fig. 1]
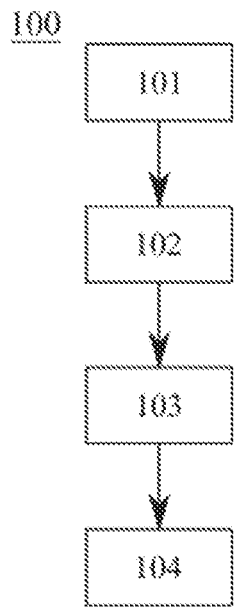
[Fig. 2A]
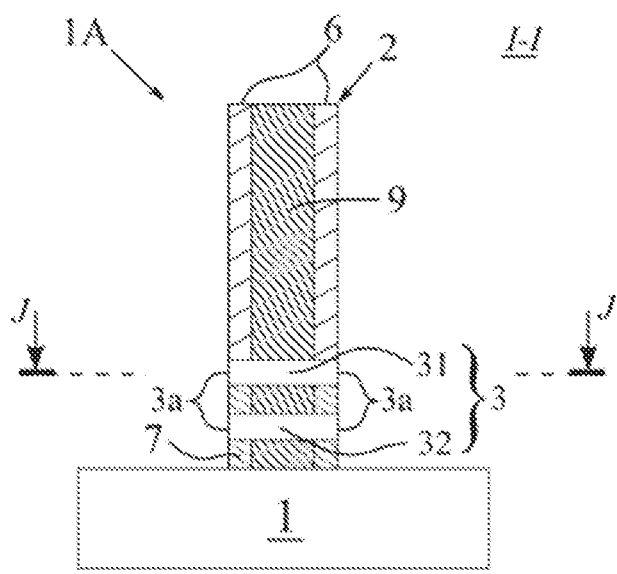

[Fig. 2B]
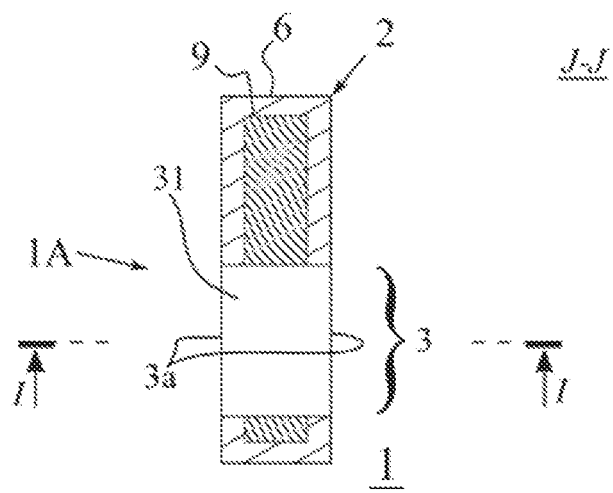
[Fig. 3]
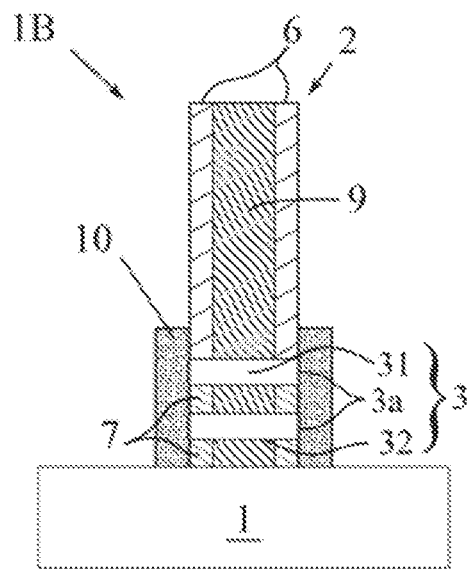

[Fig. 4]
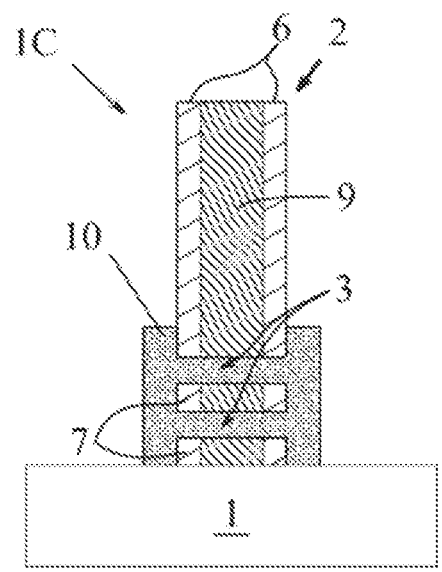
[Fig. 5]
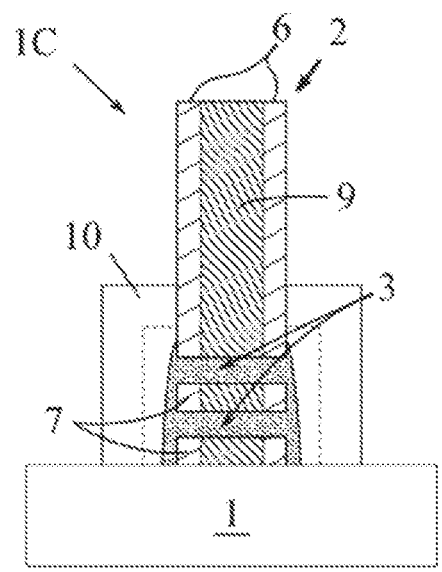

[Fig. 6]
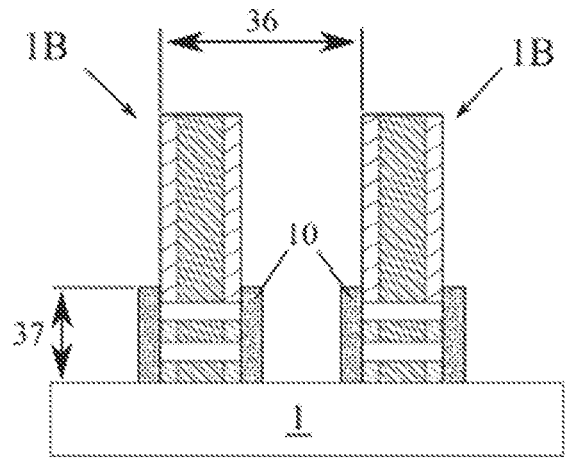
[Fig. 7]
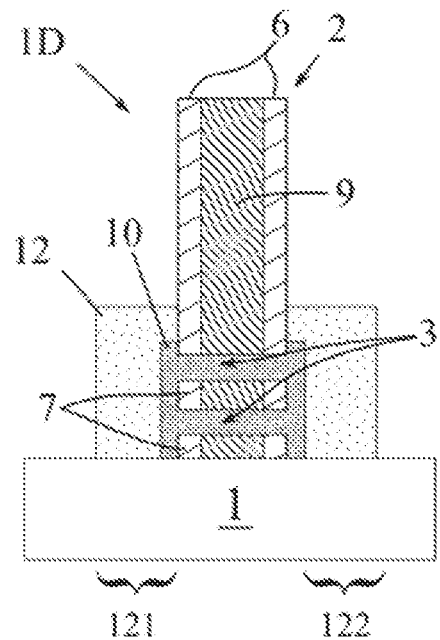

[Fig. 8]
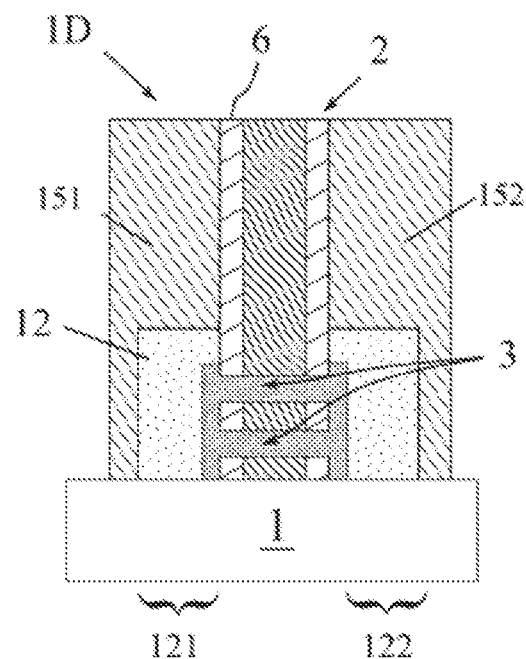

[Fig. 9]
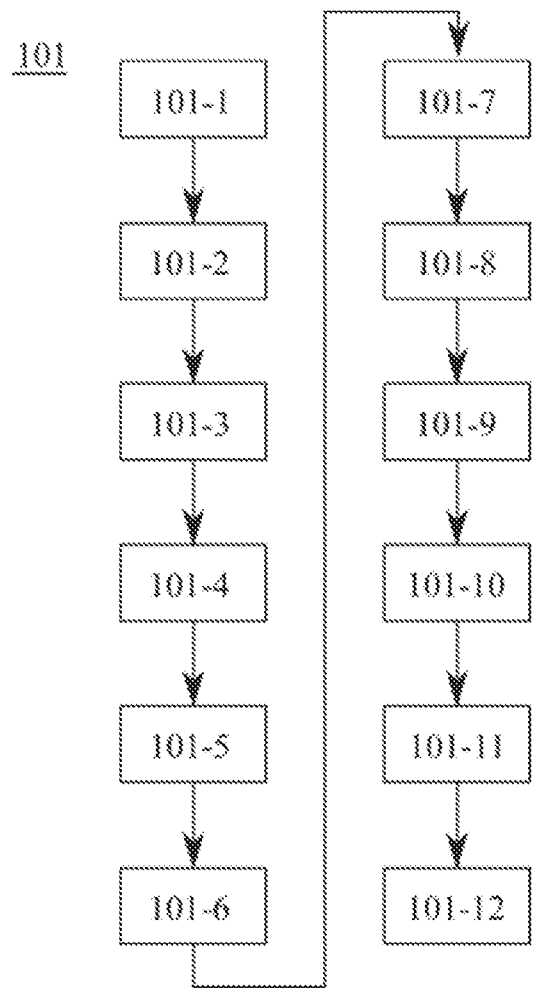
[Fig. 10]
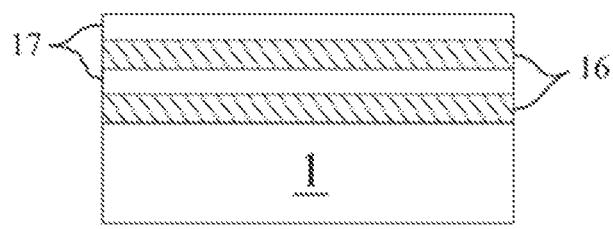
[Fig. 11A]
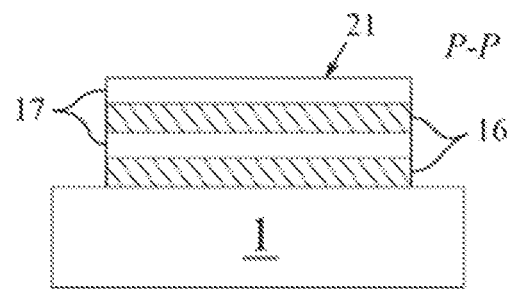

[Fig. 11B]
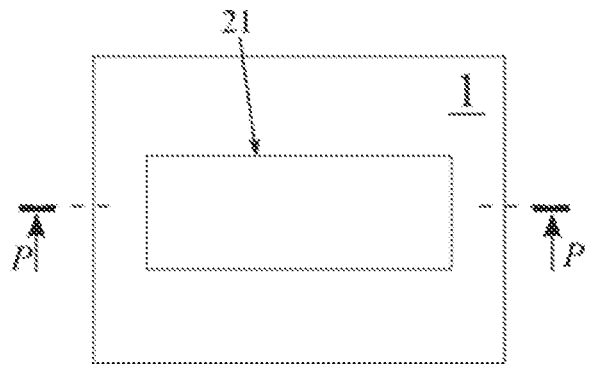
[Fig. 11C]
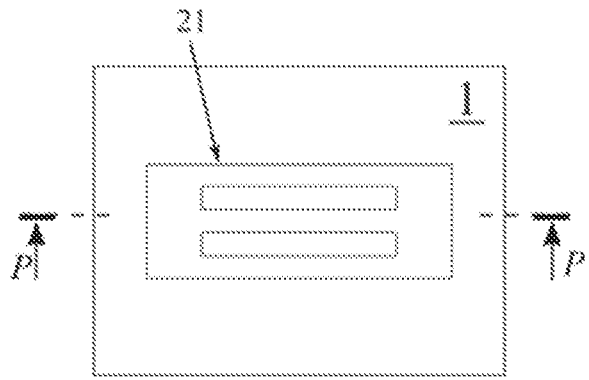
[Fig. 12]
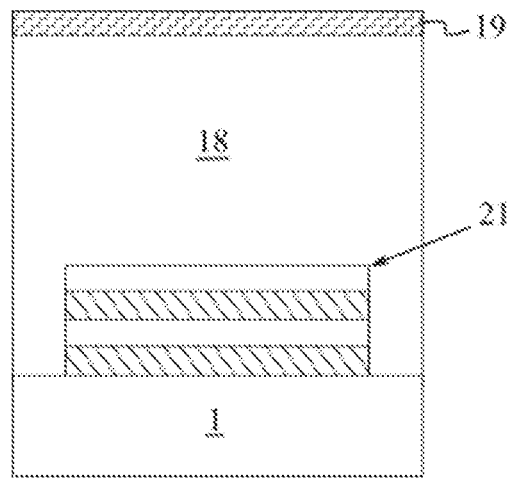

[Fig. 13A]
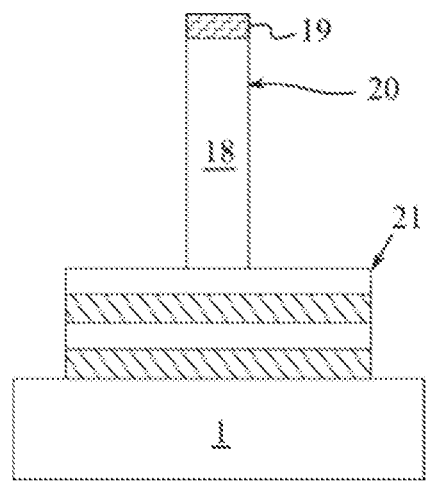
[Fig. 13B]
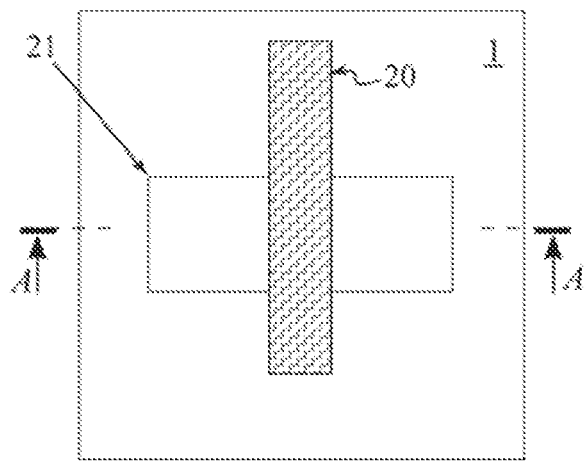
[Fig. 13C]
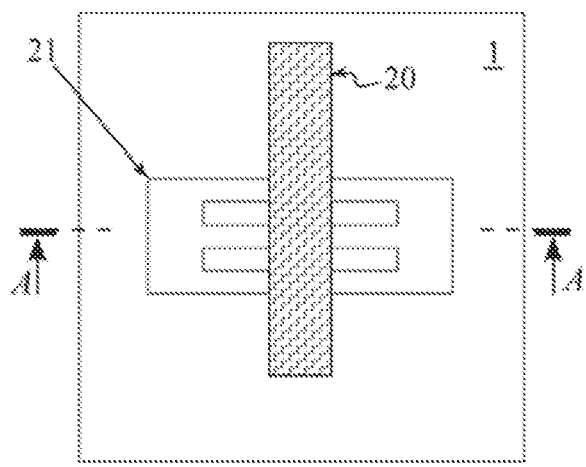

[Fig. 14]
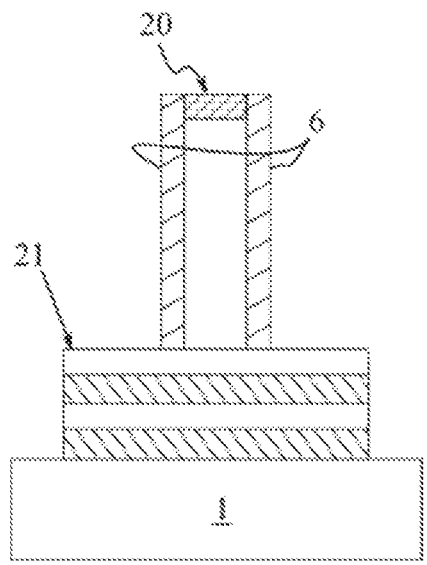
[Fig. 15]
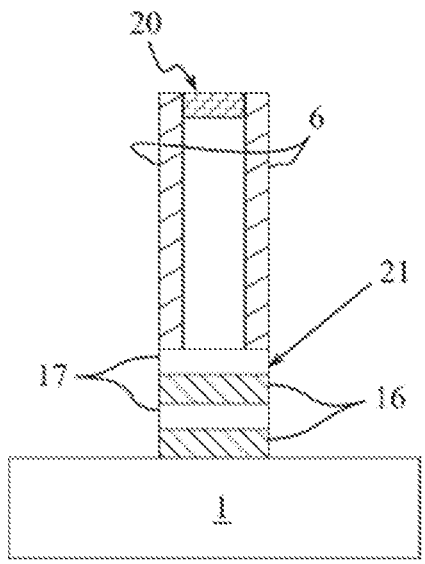

[Fig. 16]
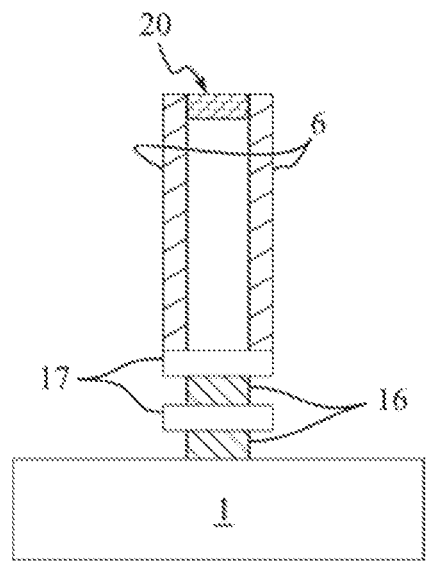
[Fig. 17]
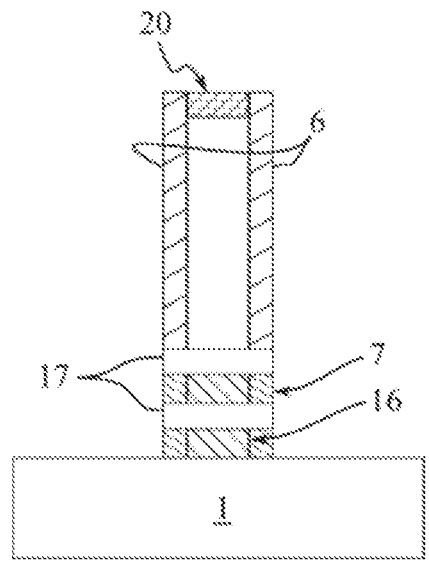

[Fig. 18]
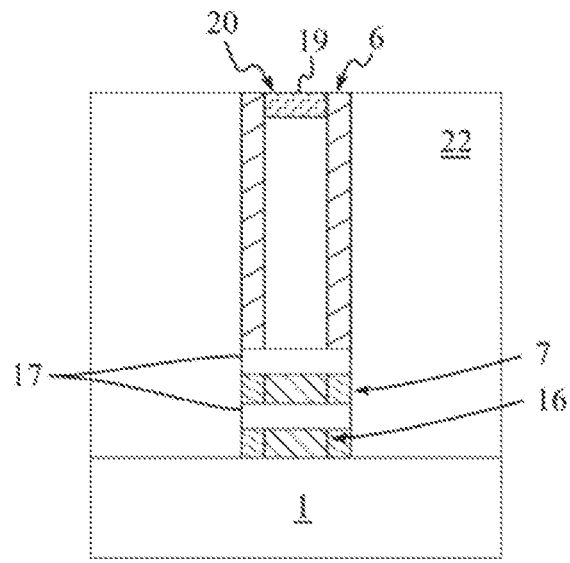
[Fig. 19]
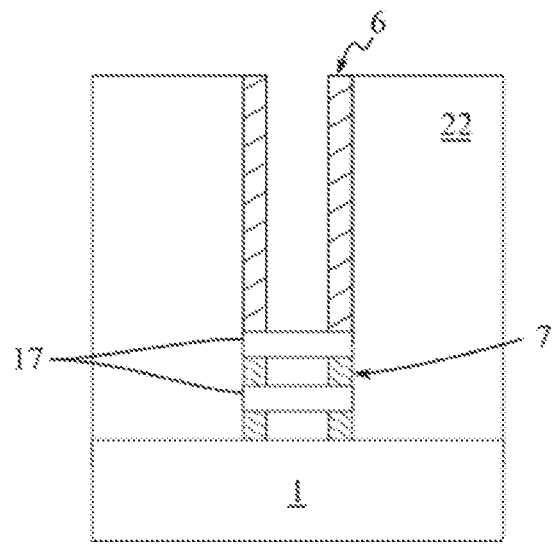

[Fig. 20]
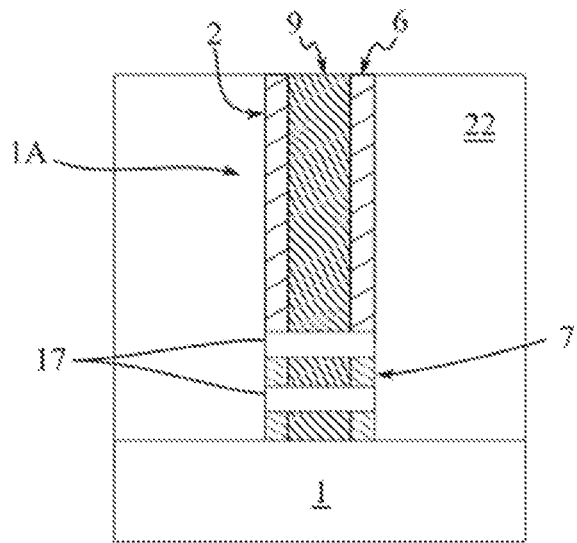
[Fig. 21A]
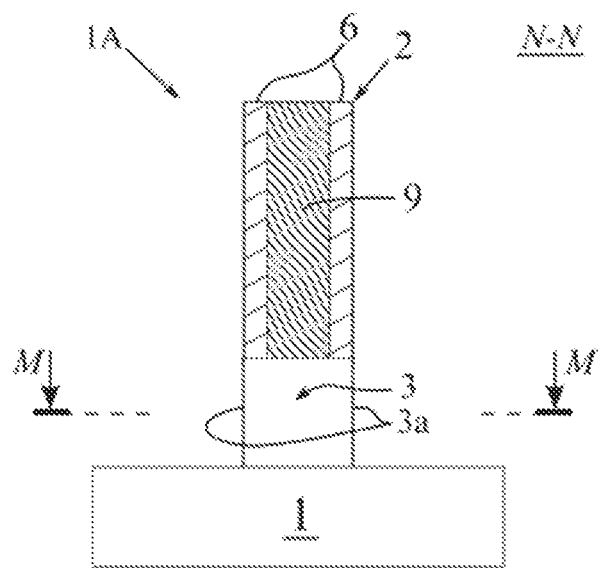

[Fig. 21B]
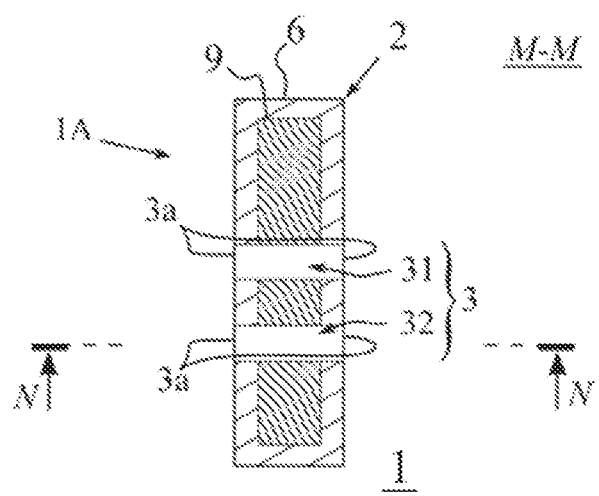
[Fig. 22]
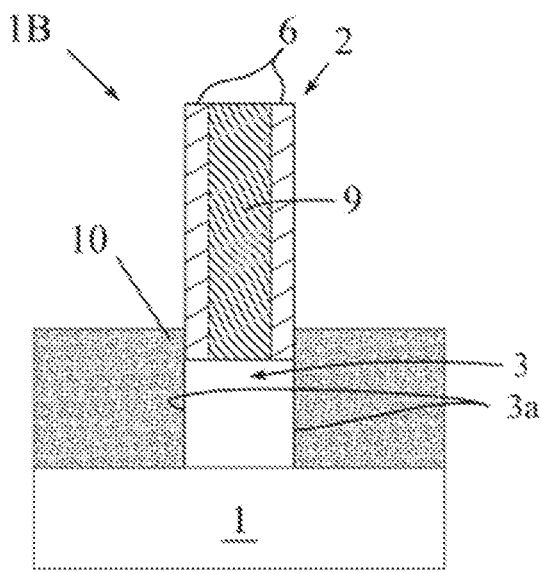

[Fig. 23]
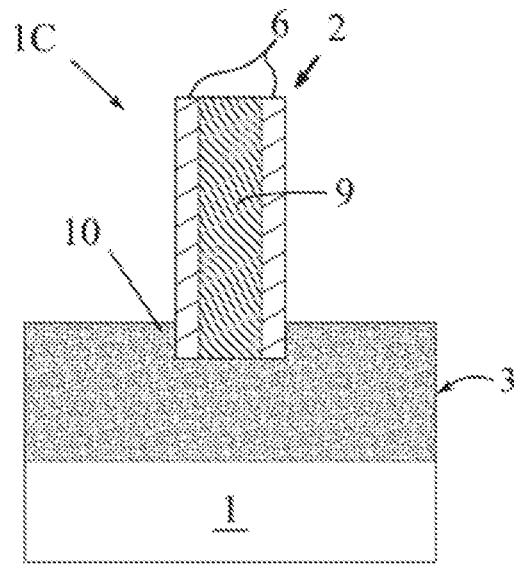
[Fig. 24]
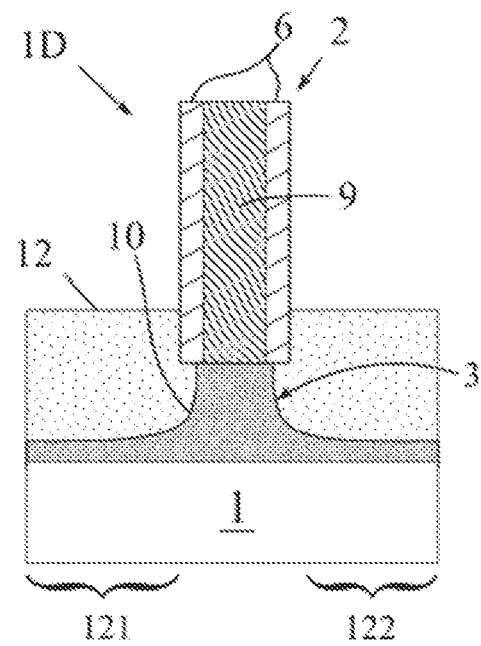

[Fig. 25A]
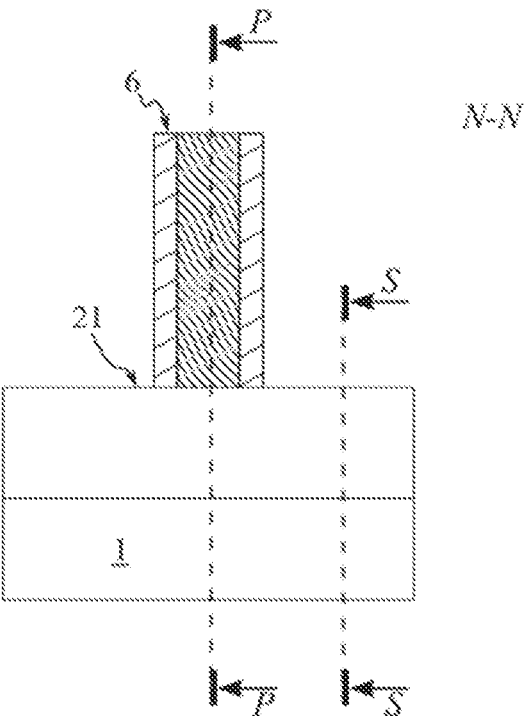
[Fig. 25B]
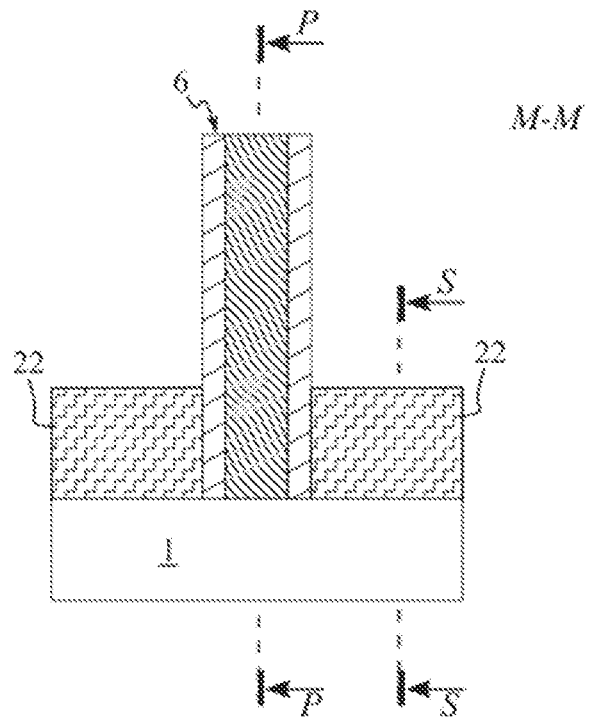

[Fig. 25C]
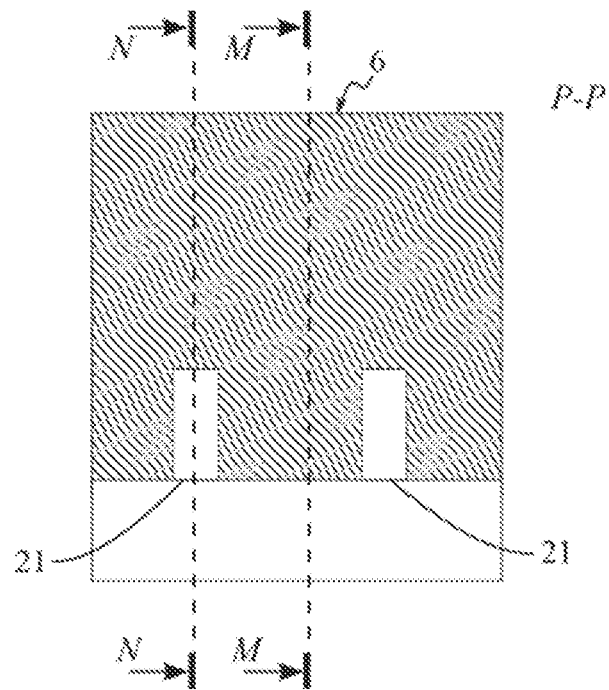
[Fig. 25D]
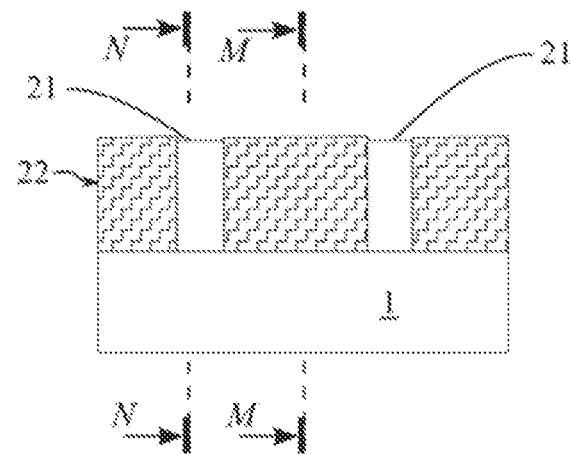

[Fig. 26A]
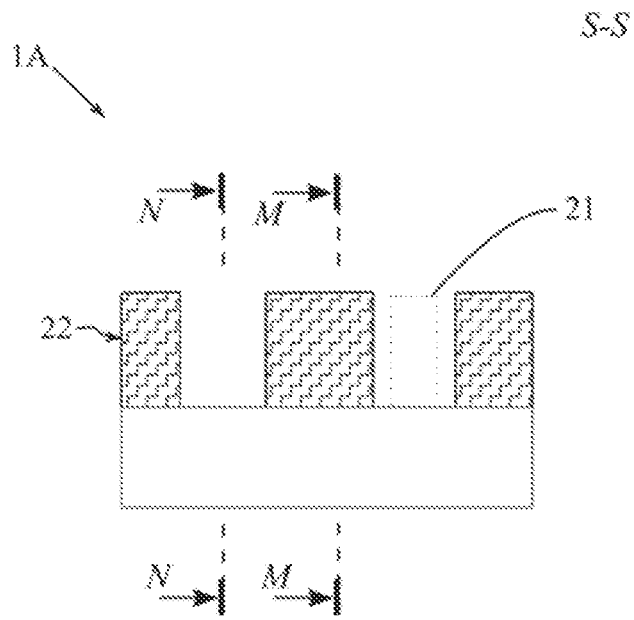
[Fig. 26B]
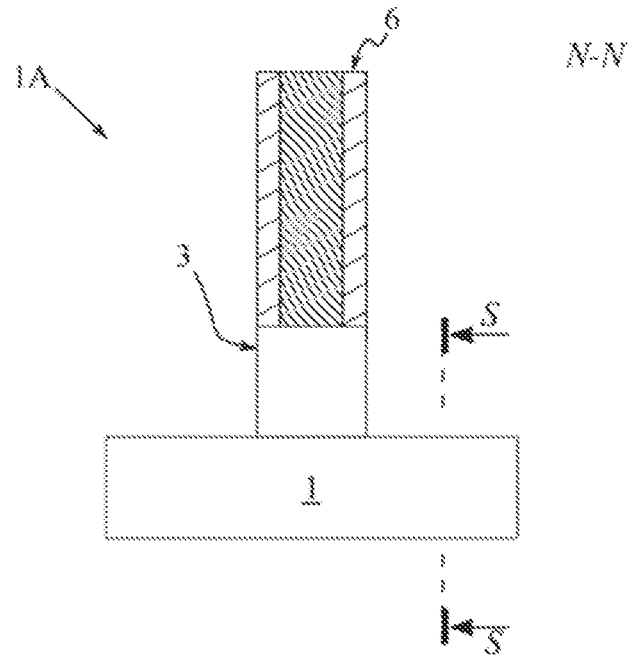

[Fig. 27]
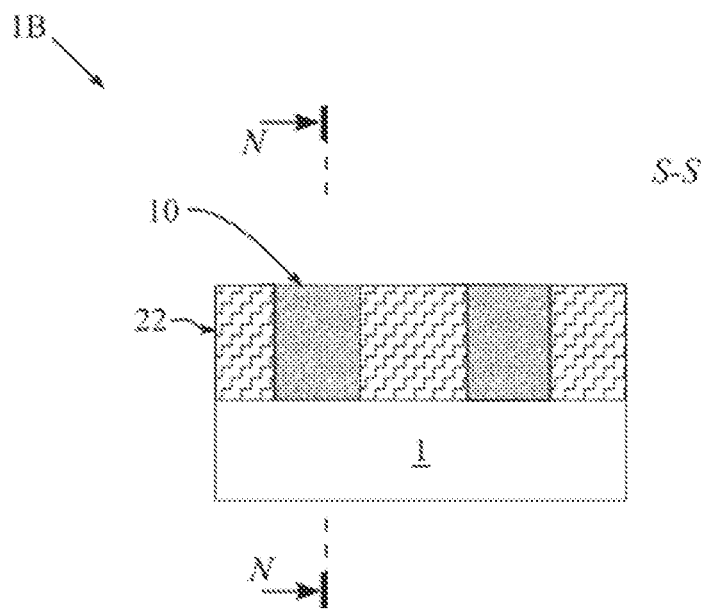
[Fig. 28]
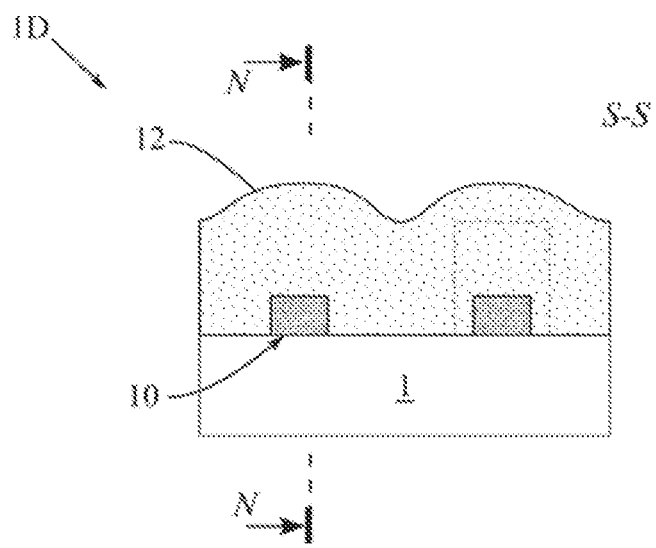

[Fig. 29]
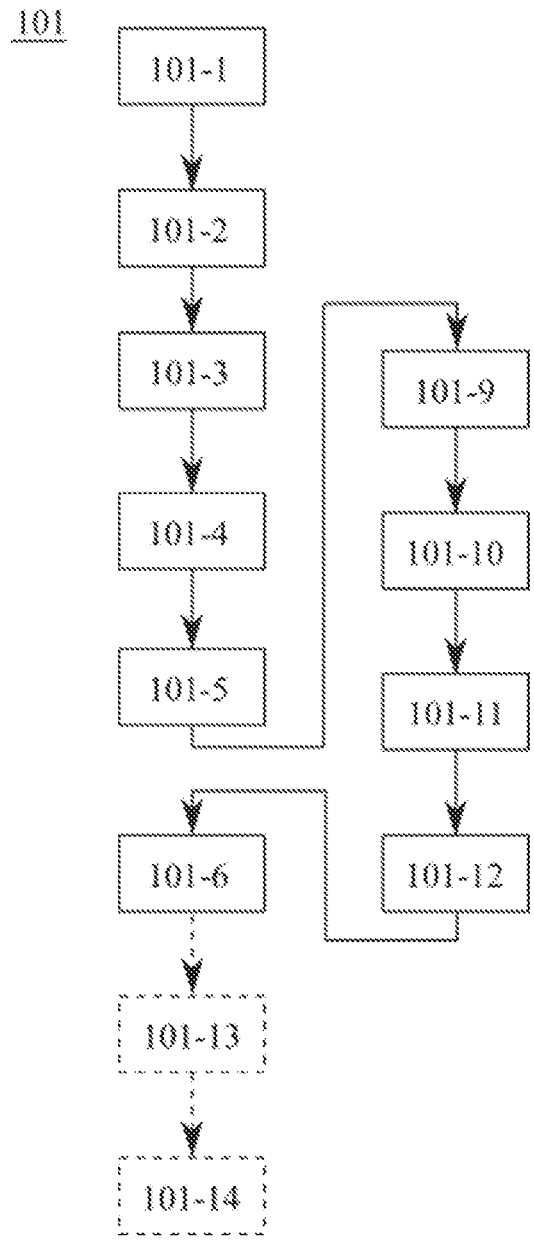
[Fig. 30]
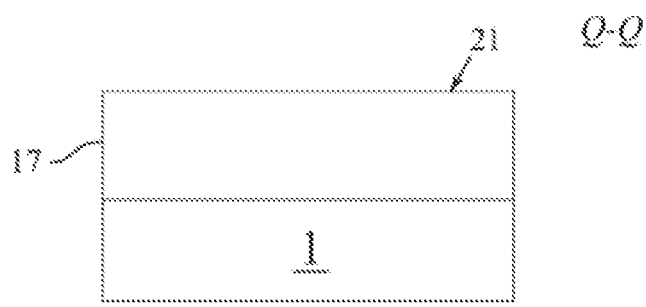

[Fig. 31A]
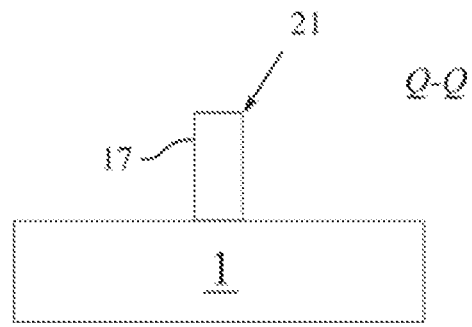
[Fig. 31B]
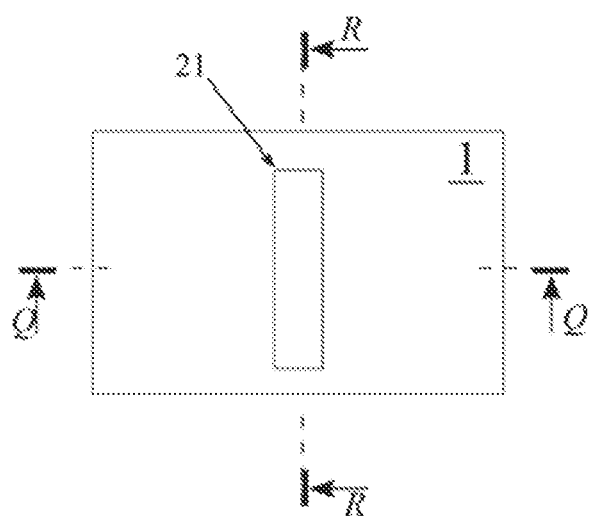
[Fig. 32]
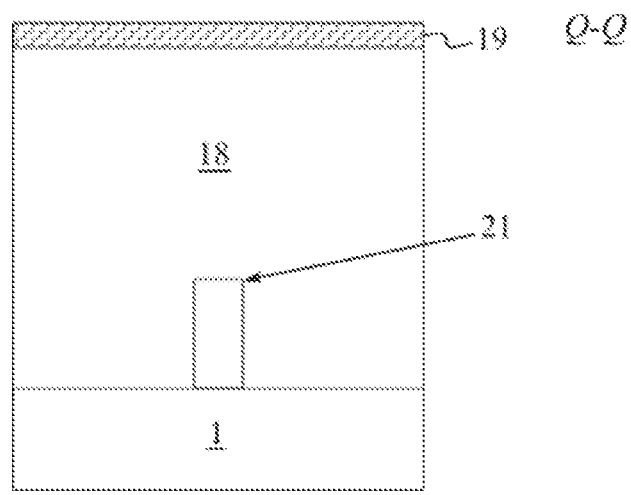

[Fig. 33A]
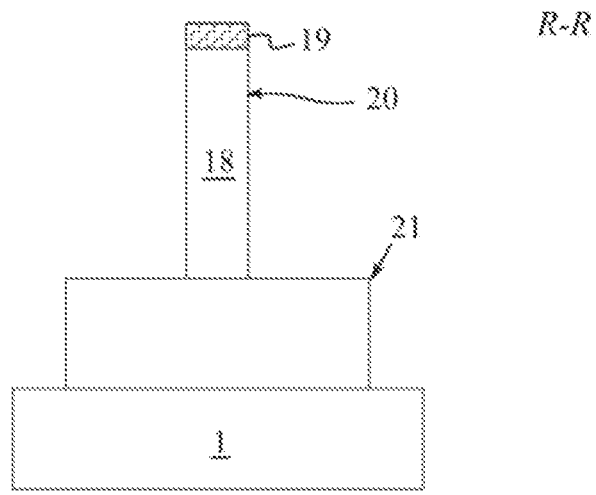
[Fig. 33B]
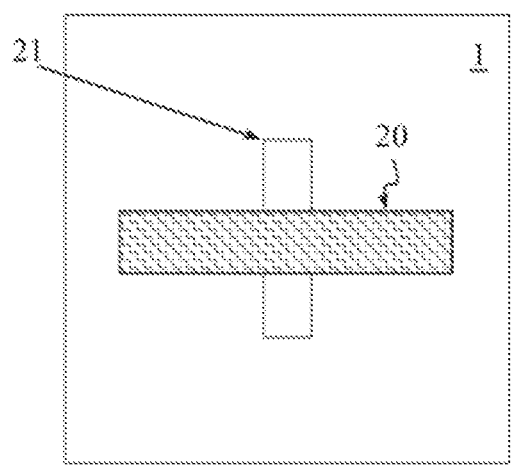
[Fig. 34]
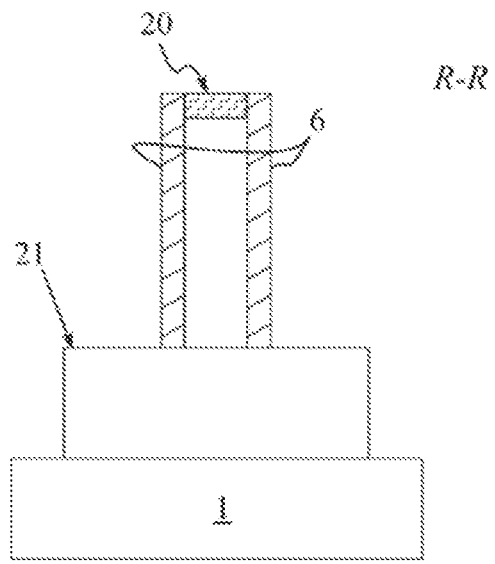

[Fig. 35]
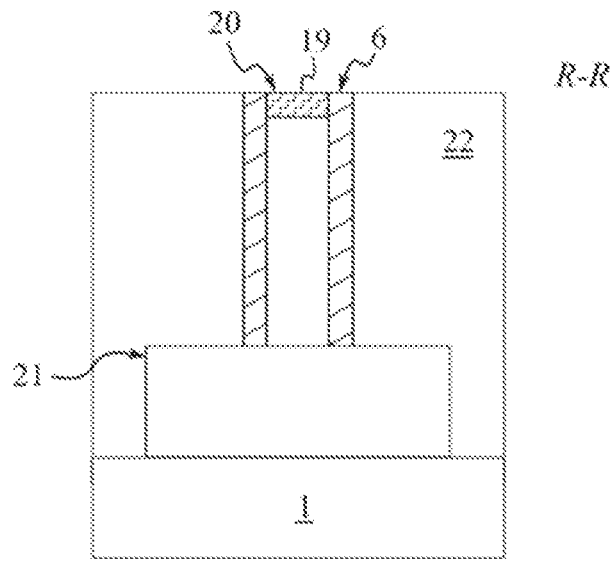
[Fig. 36]
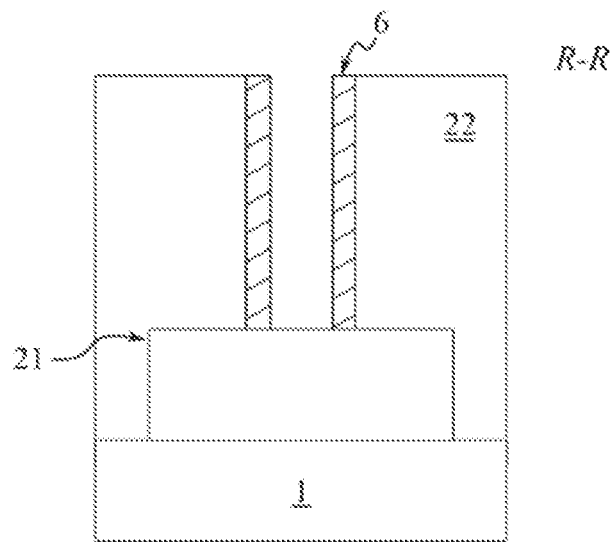

[Fig. 37]
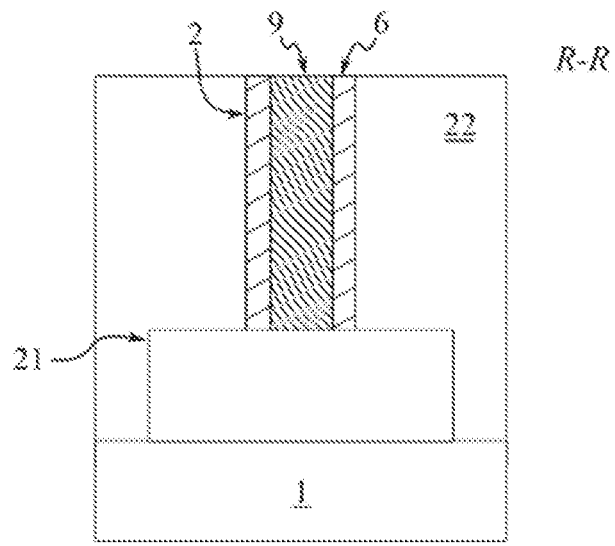
[Fig. 38]
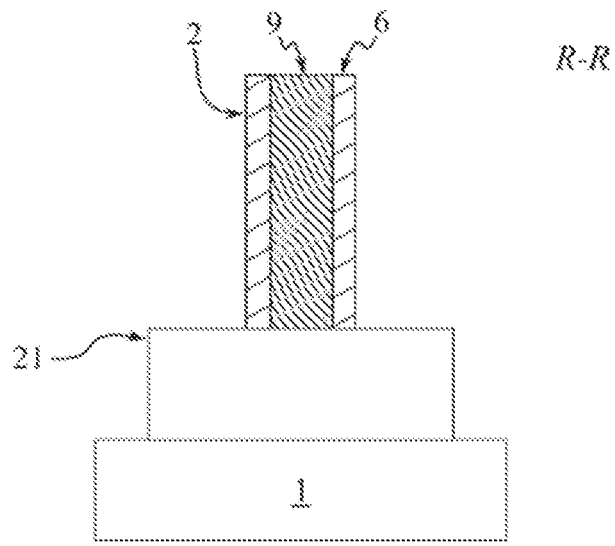

[Fig. 39]
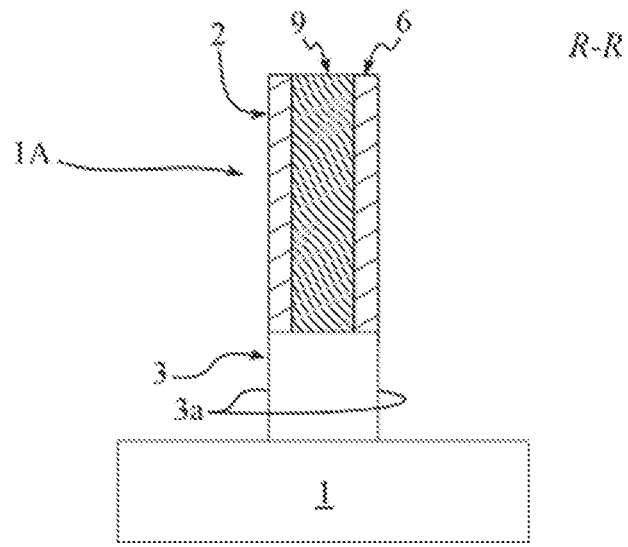
[Fig. 40]
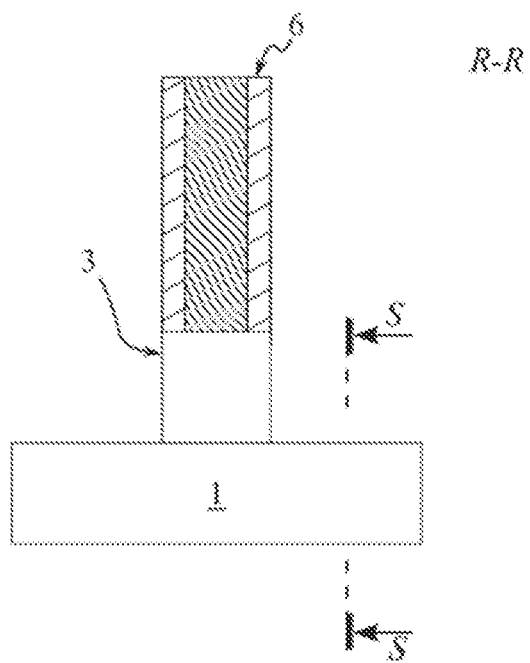

[Fig. 41]
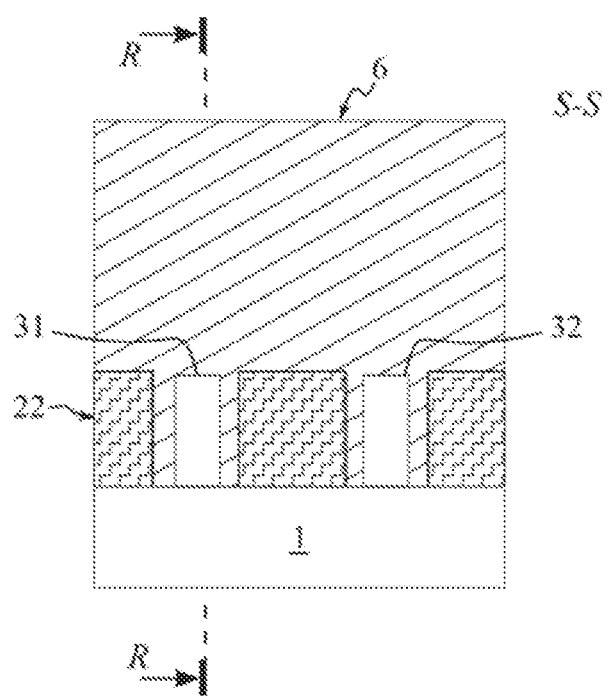

[Fig. 42]
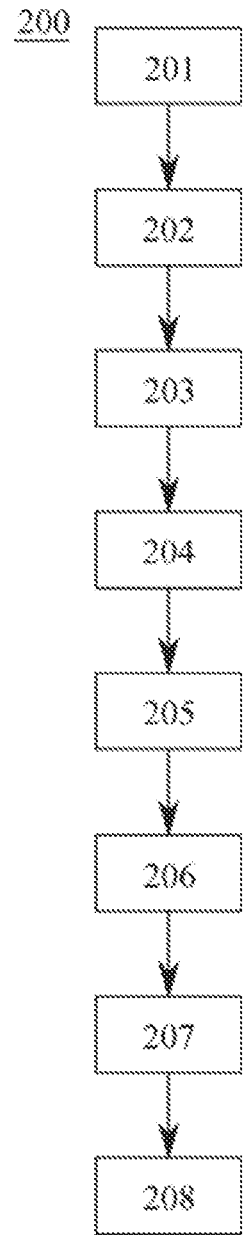

[Fig. 43A]
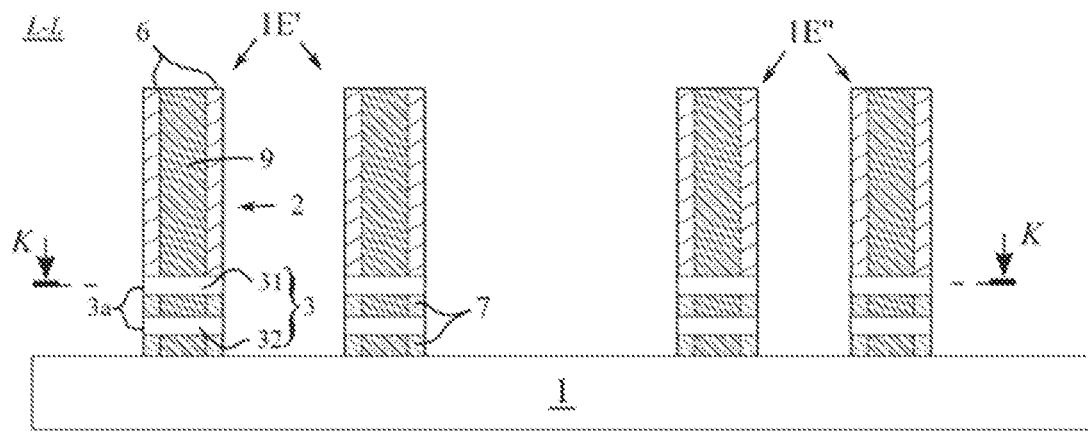
[Fig. 43B]
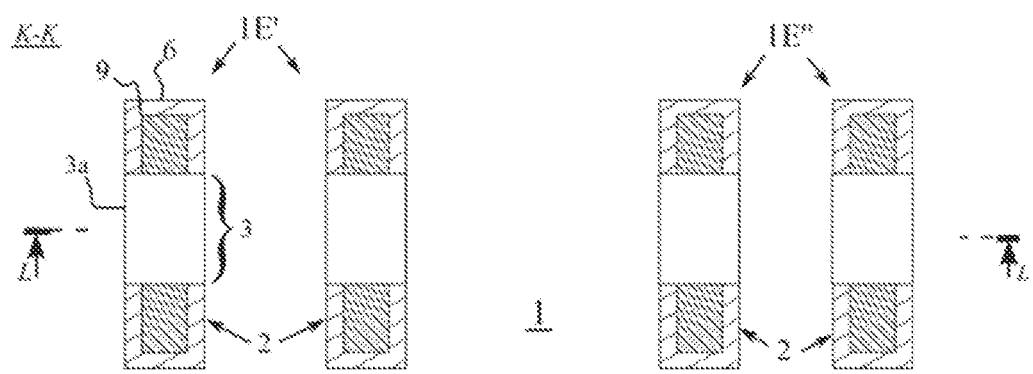
[Fig. 44]
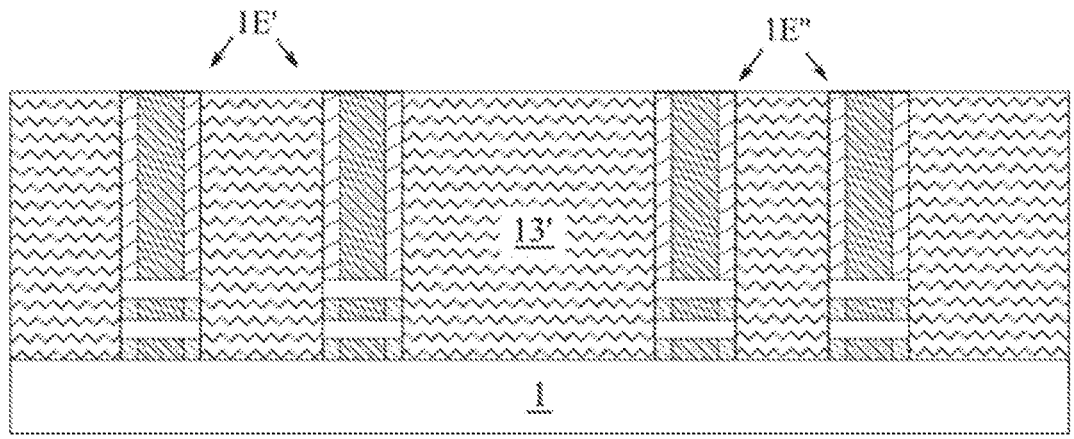

[Fig. 45]
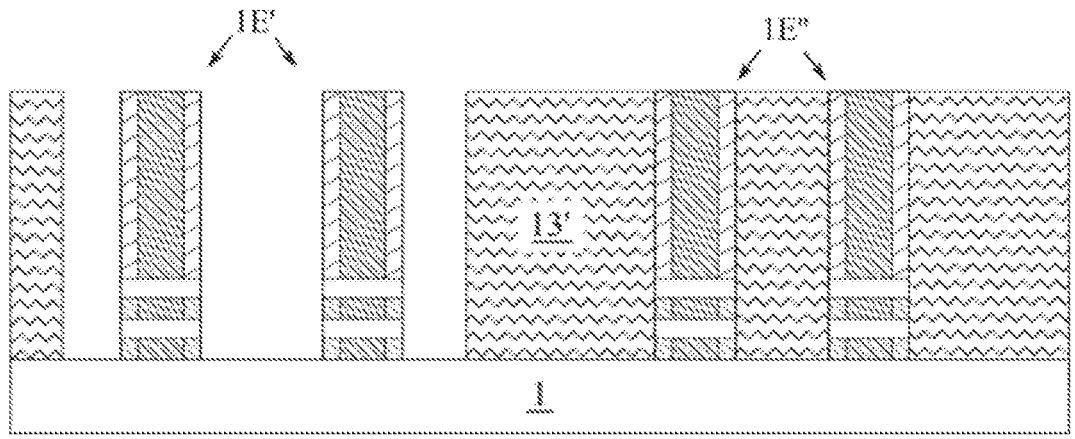
[Fig. 46]
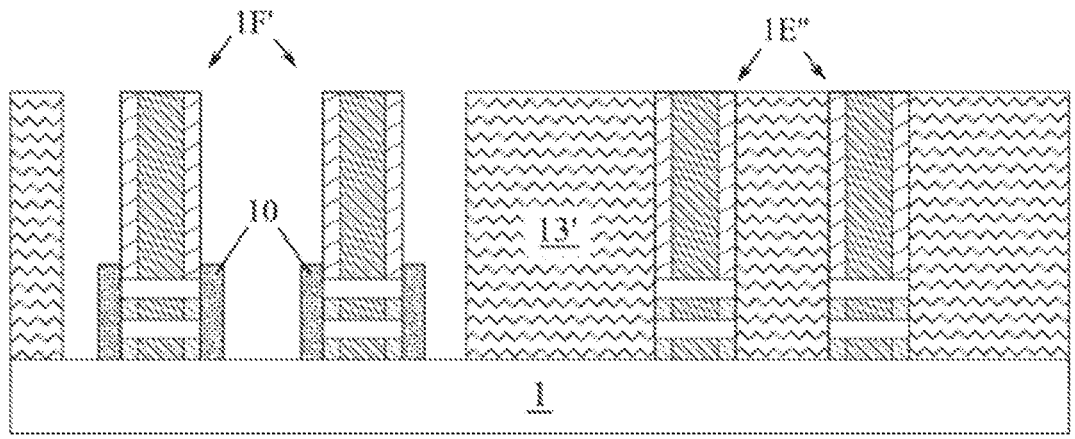
[Fig. 47]
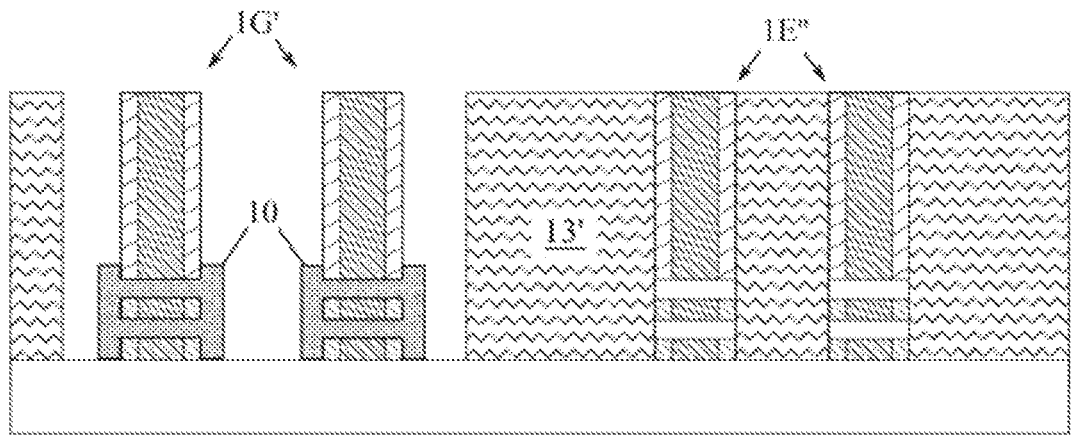

[Fig. 48]
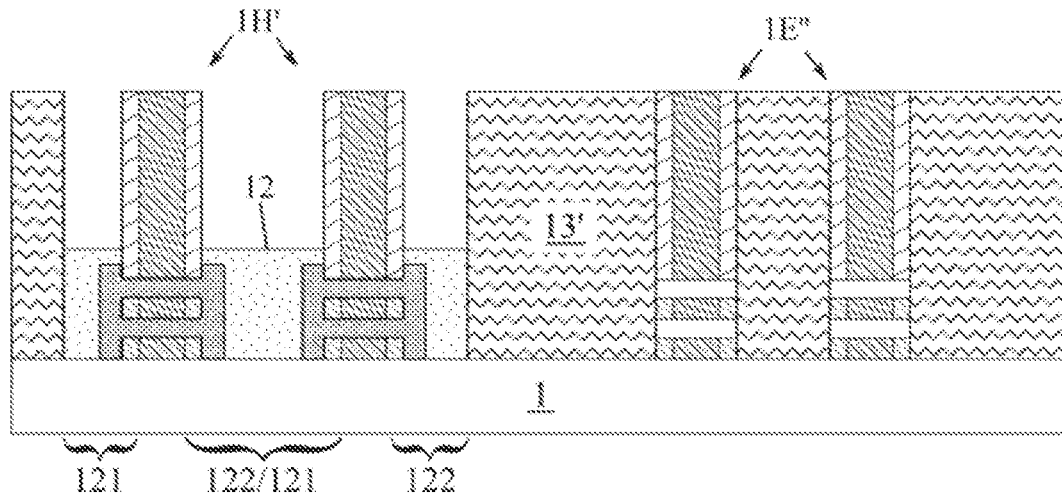
[Fig. 49]
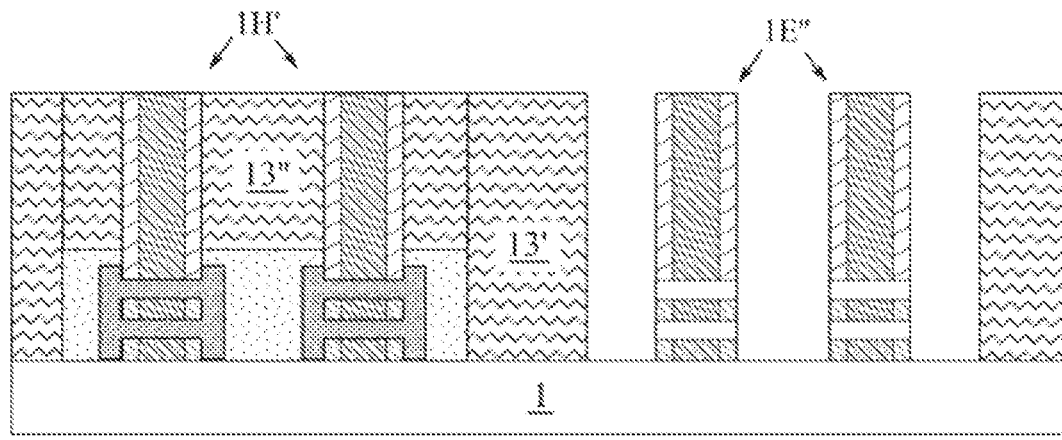
[Fig. 50]
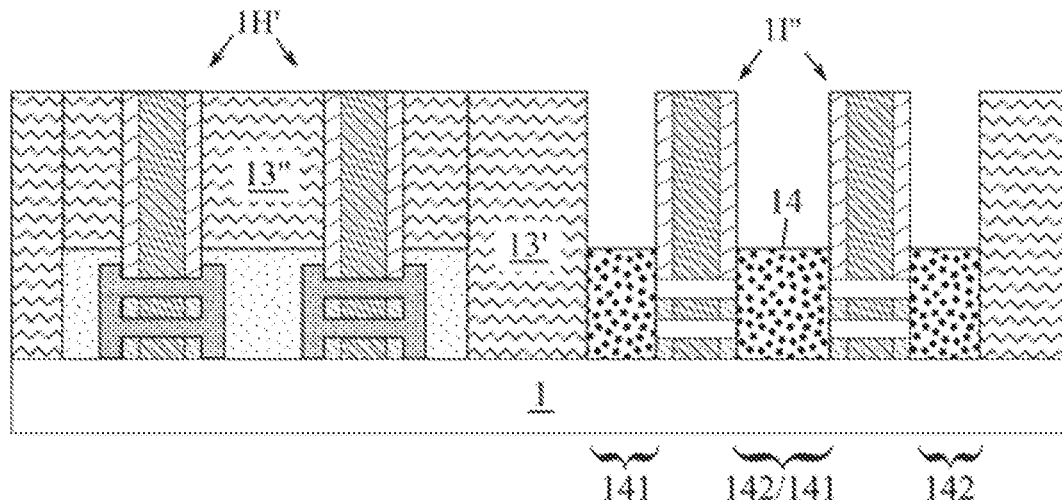

[Fig. 51]
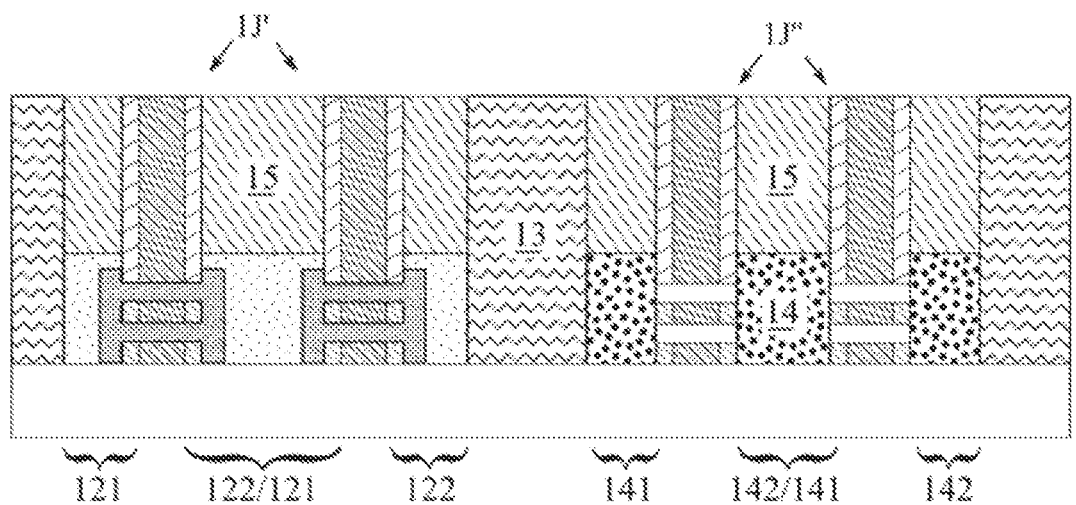

METHOD FOR MANUFACTURING A TRANSISTOR WITH A GATE-ALL-AROUND STRUCTURE

CROSS-REFERENCE TO RELATED APPLICATIONS

This application claims priority to French Patent Application No. 2105519, filed May 27, 2021, the entire content of which is incorporated herein by reference in its entirety.

FIELD

The technical field of the invention is that of field effect transistors (FET), comprising a channel made of a semiconductor material surrounded by a gate structure. It entails for example FET transistors referred to as gate all around, also called GAAFET for "gate all around field-effect transistor", and so-called FET transistors with fins, also called FinFET for "fin field-effect transistor". The field of the invention relates more particularly to the manufacture of a transistor of this type.

BACKGROUND

An FET transistor, comprises a channel made from semiconductor material arranged between a drain region and a source region. The conductivity of the semiconductor portions forming the channel is influenced by a gate located in the vicinity of each portion. In order to improve the effectiveness of the FET transistors FET and reduce their size, the gate is beneficially arranged on several sides of the channel in such a way as to improve the electrostatic influence of the gate on each semiconductor portion. For example, a FinFET transistor architecture comprises a channel comprising at least one semiconductor fin, oriented vertically with respect to the substrate and of which each side is in contact with the gate. The electrostatic influence of the gate on the channel can be improved further when the latter entirely surrounds each semiconductor portion. A GAAFET transistor architecture comprises a channel comprising at least one semiconductor portion in the form of nano-wire or nano-sheet of which a portion is entirely surrounded by the gate.

Patent application FR 3043837 A1 discloses a method for manufacturing a GAAFET transistor, comprising several semiconductor nano-wires surrounded by a gate. The method for manufacturing comprises forming a stack of alternating semiconductor layers, from a substrate, a first semiconductor layer and a second semiconductor layer. The nano-wires intended to form the channel are carried out in each second layer. The method comprises in particular a selective etching of each first layer so as to allow for the forming of the gate in such a way that it can surround a portion of each nano-wire.

A GAAFET transistor can comprise a silicon-germanium channel, favouring the mobility of holes, or a silicon channel, favouring the mobility of electrons. In the first case, this then entails a so-called pFET transistor and in the second case a so-called nFET transistor.

Carrying out a pFET transistor thus requires:
forming a stack comprising, from the substrate, a first silicon layer and a second silicon-germanium layer; and
selective etching of each first silicon layer with respect to each second silicon-germanium layer.
Inversely, the carrying out of an nFET transistor requires:
forming a stack comprising, from the substrate, a first silicon-germanium layer and a second silicon layer; and
selective etching of each first silicon-germanium layer with respect to each second silicon layer.

It is therefore necessary, according to the method of the prior art, to adapt the steps of manufacturing and the equipment implemented according to whether it is desired to carry out a pFET transistor or a nFET transistor. It is in particular necessary to implement two different procedures to carry out the specific etchings of each first layer according to whether the latter is made of silicon or of silicon-germanium.

There is therefore a need to provide a method for manufacturing a silicon-germanium channel pFET transistor that more closely approaches the method for manufacturing a silicon channel nFET transistor.

SUMMARY

An aspect of the invention offers a solution to the problems mentioned hereinabove, by making it possible to form a pFET transistor from a base structure common to the manufacture of an nFET transistor.

An aspect of the invention relates to a method for manufacturing a pFET transistor, the method for manufacturing the transistor comprising the following steps:
providing a base structure comprising a silicon channel and a gate structure, the gate structure surrounding the channel leaving two flanks of the channel free;
growing a first silicon-germanium alloy layer on the flanks of the channel;
enriching the channel with germanium atoms from the first layer; and
forming a drain region and a source region on either side of the channel.

The base structure makes it possible to carry out a pFET transistor or a nFET transistor, according to whether the silicon channel is enriched or not with germanium. The method for manufacturing a pFET transistor can therefore easily be derived from that of an nFET transistor.

The enriching of the silicon channel by means of germanium atoms provides the pFET transistor with good properties. Indeed, the germanium atoms have a larger size and apply a deformation stress to the crystalline silicon lattice. This deformation has for effect to increase the mobility of the holes.

In addition to the characteristics that have just been mentioned in the preceding paragraph, the method for manufacturing according to the invention can have one or more additional characteristics among the following, taken individually or according to any technically permissible combination:
the gate structure completely surrounds a portion of the channel;
the gate structure comprises a gate electrode and a gate dielectric that separates the gate electrode from the channel;
the gate dielectric has a relative electrical permittivity greater than or equal to 20;
the gate structure comprises lateral spacers arranged on either side of the gate structure, in line with each flank of the channel;
the channel of the base structure comprises a silicon nano-sheet and desirably a plurality of silicon nano-sheets parallel to one another;
the channel of the base structure comprises a silicon nano-wire and desirably a plurality of silicon nano-wires parallel to one another;

the channel of the base structure comprises a silicon fin and desirably a plurality of silicon fins parallel to one another;

the channel of the base structure comprises at least one silicon nano-sheet or at least one silicon nano-wire or at least one silicon fin, desirably a plurality of stacked silicon nano-sheets or a plurality of stacked silicon nano-wires or a plurality of silicon fins parallel to one another;

the channel of the base structure comprises a plurality of silicon fins parallel to one another and the base structure comprises pads made of dielectric material arranged on either side of the channel between each silicon fin;

the method for manufacturing comprises the removal of the pads after the enriching of the channel;

the growth of the first layer made from silicon-germanium alloy is initiated from flanks of each silicon nano-sheet or from flanks of each silicon nano-wire or from flanks of each silicon fin;

the enriching is configured to transform the silicon of the channel into a silicon-germanium alloy;

the enriching is carried out by application of a diffusion anneal configured to diffuse germanium atoms from the first layer in the channel;

the enriching is carried out via oxidation of the first layer configured to condense germanium atoms from the first layer in the channel;

the condensation of germanium atoms in the channel is caused by the oxidation of the first layer, desirably supplemented by the application of an anneal;

the forming of the drain and source regions is carried out by the forming of a second layer on the first layer on either side of the channel, the forming of the second layer being configured to apply a compressive stress on the channel;

the forming of the second layer is configured to apply a compressive stress on the channel;

the second layer is formed by epitaxy;

the providing of the base structure comprises: forming, on a substrate, an active zone, a sacrificial gate on a portion of the active zone and first lateral spacers on either side of the sacrificial gate; delimiting the channel from the active zone by forming the free flanks of the channel in line with the first lateral spacers (6); and forming the gate structure by replacing the sacrificial gate;

forming the active zone comprises forming a stack and delimiting the active zone from the stack;

the active zone comprises a silicon layer;

the active zone comprises a stack of layers comprising at least one silicon-germanium layer and at least one silicon layer in alternation, the stack of layers starting, from the substrate, with a silicon-germanium layer;

forming the gate structure comprises a replacing of said at least one silicon-germanium layer with a gate dielectric and a gate electrode the gate structure further replaces said at least one silicon-germanium layer.

An aspect of the invention further relates to a method for manufacturing a plurality of pFET transistors, each pFET transistor being obtained by implementing the method for manufacturing a pFET transistor according to the invention.

In addition to the characteristics that have just been mentioned in the preceding paragraph, the method for manufacturing a plurality of pFET transistors according to the invention can have one or more additional characteristics among the following, taken individually or according to any technically permissible combination:

the pFET transistors are manufactured simultaneously;

enriching channel regions by oxidation is chosen when the thickness of each first layer is less than half the distance that separates the gate structures from two consecutive base structures;

enriching channel regions by application of an anneal is chosen when the thickness of each first layer is greater than or equal to half of the distance that separates the gate structures from two consecutive base structures.

Realising pFET and nFET transistors on the same substrate, referred to as cointegration, according to the methods of the prior art, requires carrying out specific steps of manufacturing on first structures intended to form a pFET transistor or on second structures intended to form an nFET transistor. It is thus desirable to protect the first structures several times when the step of manufacturing concerns the second structures and inversely. The method for manufacturing thus comprises several steps of protecting/releasing first or second structures. There is therefore a need to improve the method of cointegrating pFET and nFET transistors.

The invention offers a solution to the cointegration of pFET and nFET transistors on the same substrate by allowing for the providing of the same base structure.

Thus, an aspect of the invention also relates to a method of cointegrating a first transistor pFET and a second nFET transistor, the method of cointegrating comprising the following steps:

providing a first base structure and a second base structure identical to the first base structure, each base structure comprising a silicon channel and a gate structure, the gate structure surrounding the channel leaving two flanks of the channel free;

on the first base structure: growing a first silicon-germanium alloy layer on the flanks of the channel; enriching the channel with germanium atoms from the first layer; forming a first drain region and a first source region on either side of the channel; and on the second base structure, forming a second drain region and a second source region on either side of the channel.

The base structure comprises a complete channel, that is sufficient to enrich or not according to the type of transistor desired, and a definitive gate structure. The selective steps of protecting/releasing during the providing of the first and second base structures are therefore suppressed. The method for cointegrating is therefore improved because it is simplified.

In addition to the characteristics that have just been mentioned in the preceding paragraph, the method of cointegrating according to the invention can have one or more additional characteristics among the following, taken individually or according to any technically permissible combination:

the method of cointegrating comprises, before the step of growing applied to the first base structure, protecting the second base structure by means of a first protective layer;

the method of cointegrating comprises, before the step of forming applied to the second base structure, releasing the second base structure by removing the first protective layer;

the method of cointegrating comprises, before the step of forming applied to the second base structure, protecting the first pFET transistor by means of a second protective layer.

BRIEF DESCRIPTION OF THE FIGURES

The invention and its different applications shall be better understood when reading the following description and examining the accompanying figures.

The figures are presented for the purposes of information and in no way limit the invention.

FIG. 1 shows a flowchart of a method for manufacturing a pFET transistor according to the invention.

FIG. 2A, FIG. 2B, FIG. 3, FIG. 4, FIG. 5, FIG. 6, FIG. 7 and FIG. 8 diagrammatically show steps of the method for manufacturing of FIG. 1.

FIG. 9 shows a first flowchart of a step of providing a base structure according to the invention.

FIG. 10, FIG. 11A, FIG. 11B, FIG. 11C, FIG. 12, FIG. 13A, FIG. 13B, FIG. 13C, FIG. 14, FIG. 15, FIG. 16, FIG. 17, FIG. 18, FIG. 19 and FIG. 20 diagrammatically show substeps of the step of providing of FIG. 9.

FIG. 21A, FIG. 21B, FIG. 22, FIG. 23, FIG. 24, FIG. 25A, FIG. 25B, FIG. 25C, FIG. 25D, FIG. 26A, FIG. 26B, FIG. 27 and FIG. 28 diagrammatically show steps of manufacturing of the method of FIG. 1.

FIG. 29 shows a second flowchart of a step of providing according to the invention.

FIG. 30, FIG. 31A, FIG. 31B, FIG. 32, FIG. 33A, FIG. 33B, FIG. 34, FIG. 35, FIG. 36, FIG. 37, FIG. 38, FIG. 39, FIG. 40 and FIG. 41 diagrammatically show substeps of the step of providing of FIG. 29.

FIG. 42 shows a flowchart of a method for providing according to the invention.

FIG. 43A, FIG. 43B, FIG. 44, FIG. 45, FIG. 46, FIG. 47, FIG. 48, FIG. 49, FIG. 50 and FIG. 51 diagrammatically show steps of the method of FIG. 42.

Unless mentioned otherwise, the same element appearing in different figures has a unique reference. The figures are presented for the purposes of information and in no way limit the invention.

DETAILED DESCRIPTION

FIG. 1 shows a flowchart corresponding to an embodiment of a method for manufacturing a pFET transistor. The transistor obtained 1D is diagrammatically shown in FIG. 7 and FIG. 8. A base structure 1A and intermediate structures 1B, 1C obtained at the end of each one of the steps of the method for manufacturing 100 are diagrammatically shown in FIG. 2A to FIG. 6.

A first step 101 of the method for manufacturing 100 comprises providing a base structure 1A, from which the pFET transistor pFET will be carried out. FIG. 2A and FIG. 2B diagrammatically show the base structure 1A according to a first embodiment. FIG. 2A shows a cross-section view of the base structure 1A according to a plane I-I materialised in FIG. 2B. FIG. 2B shows a top view of the base structure 1A according to a plane J-J materialised in FIG. 2A.

The base structure 1A is arranged on a substrate 1. It comprises a channel 3 surrounded by a gate structure 2. The channel 3 can beneficially comprise one or more semiconductor layers forming conduction channels of the pFET transistor. In the embodiment of FIG. 2A, the channel 3 comprises two semiconductor layers 31, 32 parallel to the substrate 1. Each one of the semiconductor layers 31, 32 is surrounded by the gate structure 2. The two semiconductor layers 31, 32 can be superimposed one on the other. The two semiconductor layers 31, 32 can also be called nano-sheet. The term nano-sheet means a layer extending in a plane parallel to the surface of the substrate and desirably having a thickness less than 20 nm, the thickness being measured perpendicularly with respect to the surface of the substrate 1.

Another example of a base structure 1A, having semiconductor layers oriented vertically with respect to the surface of the substrate 1, shall be described later in reference to FIG. 21A and FIG. 21B.

The substrate 1 can be made of solid silicon or of the silicon on insulator type (SOI). In the latter case, it comprises an insulating layer buried under a thin layer of non-doped silicon. The substrate 1 can be, in an embodiment, of the silicon on insulator type that is fully depleted (or FDSOI for "Fully Depleted Silicon on Insulator") in order to improve the electronic characteristics of the final transistor.

Each nano-sheet 31, 32 of the channel 3 has two opposite ends, intended to be contacted by drain and source regions. The two ends of each nano-sheet form free surfaces that belong to the flanks 3a of the channel 3. The base structure 1A of FIG. 2A and FIG. 2B makes it possible to carry out a gate-all-around transistor, referred to as the GAAFET type.

The base structure 1A is remarkable in that each one of the semiconductor nano-sheets 31, 32 of the channel 3 is made from silicon. The base structure 1A can therefore also be implemented in a method for manufacturing an nFET transistor (the channel of an nFET transistor being made from silicon).

The gate structure 2 comprises a gate electrode 9, a gate oxide (not shown) arranged between the channel 3 and the gate electrode 9, and first and second lateral spacers 6, 7. The gate electrode 9 is intended to apply an electrostatic potential on the channel 3 and is desirably positioned all around a central portion of the channel 3. The first and second lateral spacers 6, 7 are arranged on either side of the gate electrode 9 and create an electrical insulation between the gate electrode 9 and the future source and drain regions. The first and second lateral spacers 6, 7 are desirably arranged, in line with the ends of each layer 31, 32 on the channel 3. In this way, the gate structure 2 surrounds the channel 3 by leaving the flanks 3a of the channel 3 apparent. The flanks 3a can also be called sidewalls.

FIG. 3 shows a first intermediate structure 1B obtained at the end of a second step 102 of the method for manufacturing 100. This second step 102 comprises growing a first layer 10 made from silicon-germanium alloy on the flanks 3a of the channel 3 of the base structure 1A. The first layer 10 can also be called reservoir layer. The reservoir layer 10 is arranged on either side of the gate structure 2, in contact with each flank 3a of the channel 3. The reservoir layer 10 is for example carried out by epitaxy from the free ends of each semiconductor nano-sheet 31, 32, i.e. at each flank 3a. The epitaxy is thus initiated from silicon layers of the channel 3. The reservoir layer 10 is made from silicon-germanium alloy and can be doped or intrinsic.

FIG. 4 shows a second intermediate structure 1C obtained at the end of an enriching 103 of the channel 3 with germanium atoms of the reservoir layer 10. The enriching 103 is beneficially configured to transform the silicon of the channel 3, i.e. nano-sheets 31, 32, into a silicon-germanium alloy. Thus, the channel 3 obtained corresponds to a channel of a transistor of the pFET type.

The enriching 103 of the channel by means of germanium atoms makes it possible to improve the mobility of charge carriers of the pFET transistor, here of the holes. Indeed, the germanium atoms have a diameter, and therefore a mesh parameter, that is greater than silicon atoms. The integration thereof into the crystalline lattice therefore imposes a deformation stress of the silicon lattice, which has for effect an improvement in the mobility of the holes. This effect can be particularly beneficial when the step of providing 101 the base structure 1A tends to release the initial stress of the silicon nano-sheets, in particular during the forming of the second spacers 7. Thus, the step of enriching 103 makes it possible to put the channels back under stress and therefore to retrieve, even exceed, the initial mobility of the holes. In order to significantly improve the mobility of holes, the concentration of germanium atoms in the silicon-germanium alloy is beneficially greater than 20% of the alloy (and therefore 80% silicon). The higher the concentration in germanium atoms in the silicon-germanium alloy is, the better the mobility of the holes is. In order to benefit from an improvement in the mobility of the holes as well as the effect of the deformation stress caused by the germanium atoms, the concentration of germanium atoms in the silicon-germanium alloy is beneficially greater than or equal to 30% of the alloy.

The enriching 103 can be carried out in two different ways. According to a first embodiment, the enriching 103 is carried out via the application of a diffusion anneal on the first intermediate structure 1B, and in particular at the first layer 10 and channel 3. The diffusion anneal drives the diffusion of germanium atoms from a zone rich in germanium, i.e. the reservoir layer 10, to a zone that is germanium depleted, i.e. the channel 3 and more particularly the nano-sheets 31, 32. The diffusion anneal can be carried out at a temperature greater than or equal to 900° C. under inert atmosphere and desirably 1000° C., even 1050° C. In this way, the diffusion of the germanium within the channel 3 is effective. It is however suitable to carry out an anneal that does not degrade the gate structure 2, in particular when the latter comprises tungsten. For this, the duration of the anneal depends for example on the thermal budget of the gate structure 2. The duration of the anneal is desirably less than 1 min.

According to a second embodiment, shown in FIG. 5, the enriching 103 is carried out by condensation of the germanium in the channel 3. The condensation is carried out by oxidation of the reservoir layer 10. The silicon oxide formed pushes the germanium atoms to the channel 3 and more particularly the nano-sheets 31, 32. The oxidation of the reservoir layer 10 is desirably carried out under oxidising atmosphere. An anneal can also be applied at a temperature greater than 1000° C. for one minute in order to cause the displacement of germanium atoms and facilitates the enriching 103 and homogenise the concentration in germanium in the final layer.

The enriching 103 via diffusion requires a substantial concentration gradient between the zone rich in germanium and the zone to be enriched. A high concentration in germanium of the reservoir layer 10 is therefore necessary to effectively enrich the channel 3. The concentration in germanium of the reservoir layer 10 is for example greater than 30%, concentration from which the activation energy to allow for the displacement of the germanium atoms is greatly reduced.

On the other hand, the enriching 103 by condensation has the disadvantage of favouring the growth of an oxide layer on the reservoir layer 10, with the whole occupying a final volume that is more substantial than when the enriching 103 is carried out via diffusion. The oxide layer is desirably removed before carrying out the drain and source regions.

Enriching 103 by oxidation can be favoured when a spacing in the vicinity of the first intermediate structure 1B makes it possible to receive the increase in volume of the reservoir layer 10. The final volume depends on the initial volume of the reservoir layer 10 that is substantially proportional to the thickness of said reservoir layer 10. FIG. 6 shows the thickness 37 of the reservoir layer 10 measured perpendicularly to the substrate 1.

When a plurality of transistors are carried out on the same substrate, a lattice gate time can be defined corresponding to the spatial period of the final transistors. The lattice gate time depends in particular on a distance 36 that separates the gate structures from consecutive base structures 1A or that separates the gate structures 2 from first consecutive intermediate structures 1B. When the distance 36 that separates the consecutive gate structures 2 is greater than twice the thickness 37 of the reservoir layer 10, then the spacing between the two second intermediate structures 1B is considered as sufficient to carry out an enriching 103 by oxidation of the reservoir layer 10. On the other hand, when the distance 36 that separates the consecutive gate structures 2 is less than or equal to twice the thickness 17 of the reservoir layer 10, then the spacing between the two second intermediate structures 1B is considered as insufficient for carrying out an enriching 103 via oxidation and the application of a diffusion anneal is desired.

FIG. 7 shows a third intermediate structure 1D obtained at the end of the fourth step 104 of the method for manufacturing 100. The fourth step 104 comprises forming a drain region 121 and a source region 122 on either side of the channel 3. The intermediate structure 1D thus obtained corresponds to a pFET transistor. The forming of the drain and source regions 121, 122 is carried out by epitaxy of a p-type silicon germanium (SiGe) doped layer 12 on the first layer 10, on either side of the gate structure 2. The doped SiGe layer 12 is for example doped with boron. In order to improve the quality of the interface between the reservoir layer 10 and the doped SiGe layer 12, the doped SiGe layer is carried out by epitaxy from the reservoir layer 10. In this way, the crystalline structure of the channel and of the reservoir layer 10 is conserved and transferred to all the drain and source regions 121, 122, improving the properties of the transistor.

The growth of the doped SiGe layer 12 by epitaxy is desirably carried out on the desirably vertical flanks of the first layer 10, so as to apply a compressive stress on the flanks 3a of the channel 3 and further improve the mobility of the holes.

The step of forming drain and source regions 121, 122 can also comprise, before the deposition of the doped SiGe layer 12, a partial etching of the reservoir layer 10. The partial etching in particular makes it possible to reduce the distance between the flanks 3a of the channel 3 and the source and drain regions 121, 122. The partial etching also makes it possible to release an additional volume for the drain and source regions 121, 122. The partial etching comprises the removal of the surface oxide from the first layer 10 as well as a surface treatment by means of a plasma.

FIG. 8 shows a final structure of a transistor coming from an additional step of forming drain and source electrodes 151, 152 from drain and source regions 121, 122. The drain and source electrodes are for example made from tungsten.

The method for manufacturing 100 can make it possible to manufacture a plurality of pFET transistors simultaneously. For this, the method 100 can envisage the providing 101 of a plurality of base structures 1A such as those described in relation with FIG. 2A and FIG. 2B. Each step of the method for manufacturing 100 is beneficially carried out simultaneously on each base structure 1A.

At the step of providing 101, the base structure 1A can be covered with a protective layer made of dielectric material, for example silicon dioxide, which is removed, at least partially, to successfully complete all the steps of the method for manufacturing 100.

A first embodiment of the step of providing 101, represented by the flowchart of FIG. 9, comprises the carrying out of the base structure from a bare substrate. The step of providing 101 comprises a plurality of substeps 101-1 to 101-12. The structures obtained at the end of these substeps 101-1 to 101-12 are shown in FIG. 10 to FIG. 20. The base structure 1A coming from this first embodiment of the step of providing 101 is beneficially implemented in the carrying out of a transistor of the GAAFET type.

In a first step, the step of providing comprises forming, on a substrate 1, an active zone 21, a sacrificial gate 20 on a portion of the active zone 21 and first lateral spacers 6 on either side of the sacrificial gate 20.

For this, a first substep 101-1 comprises forming, on the substrate 1, of a stack of layers 16, 17, such as shown in FIG. 10. The formation 101-1 of said stack can be carried out as solid wafer or on a portion only of the substrate 1. The stack comprises an alternation of silicon-germanium layers 16 and silicon layers 17. The alternation starts, from substrate 1, with a silicon-germanium layer 16. The forming of the stack can be carried out by epitaxy.

A second substep 101-2 comprises delimiting an active zone 21 from the stack of layers 16, 17 of which the result is shown in FIG. 11A to FIG. 11C. The etching 101-2 is desirably carried out in such a way as to form nano-sheets, such as shown as a top view in FIG. 11B or nano-wires, such as shown as a top view in FIG. 11C. The term nano-wire means a layer that has the shape of a wire. A nano-wire desirably extends parallel to the surface of the substrate 1. A nano-wire has a thickness and a width less than its length and desirably less than 10 nm. The thickness is measured perpendicularly at the surface of the substrate. The width is measured parallel to the surface of the substrate 1 and perpendicularly to the cutting plane P-P. The length is measured parallel to the surface of the substrate 1 and parallel to the cutting plane P-P.

A third substep 101-3, shown in FIG. 12, comprises the surrounding of the active zone 21 by means of a sacrificial material 18 where on a hard mask layer 19 is then deposited. The sacrificial material 18, for example polycrystalline silicon, is intended to form a sacrificial gate. The hard mask layer 19 can be made from silicon nitride. The sacrificial material 18 covers the entire active zone 21 and has a uniform thickness from the substrate 1. This thickness is greater than or equal to the height of the gate 2. The thickness can be adjusted by mechanical and/or chemical polishing.

A fourth substep 101-4 comprises the selective etching of the hard mask layer 19 and of the sacrificial material 18 with respect to the active zone 21, in such a way as to form a sacrificial gate 20. The sacrificial gate 20 is shown in FIG. 13A to FIG. 13C. FIG. 13B and FIG. 13C show the active zone 21 and the sacrificial gate 20 as a top view. In the example of FIG. 13B, the active zone 21 comprises nano-sheets of which one region is surrounded by the sacrificial gate 20. In the example of FIG. 13C, the active zone 21 comprises nano-wires each having a region surrounded by the sacrificial gate 20. The selective etching 101-4 is carried out in such a way that the sacrificial gate 20 surrounds a region of the active zone 21 of which a portion will form the channel of the final transistor. The sacrificial gate 20 desirably has vertical flanks (i.e. perpendicular to the substrate 1) and a plateau.

A fifth substep 101-5, shown in FIG. 14, comprises forming first lateral spacers 6 against the flanks of the sacrificial gate 20. The first lateral spacers 6, also called external spacers, can be carried out in the same material as the hard mask, for example silicon nitride. The external spacers 6 can be formed by conformal deposition followed by an anisotropic etching.

The step of providing the base structure also comprises delimiting the channel 3 from the active zone 21 by forming the free flanks 3a of the channel 3 in line with the first lateral spacers 6.

For this, a sixth substep 101-6 comprises the unidirectional etching of the active zone 21 of which the result is shown in FIG. 15. The unidirectional etching 101-6 is carried out in such a way as to remove the portions of the active zone 21 that are not covered by the sacrificial gate 20 or the first lateral spacers 6. Desirably, the buried insulating layer of the substrate 1 of the SOI type is used as a stop layer of the etching of the nano-sheets 16, 17. This substep tends to relax the internal stresses of the nano-sheets 16 made of silicon-germanium, which can negatively affect the mobility of the charge carriers. However, the step of enriching of the method for manufacturing 100 makes it possible to cover the initial stress, even increase this constraint, thus making it possible to further improve the mobility of the carriers.

A seventh substep 101-7 comprises the selective etching of the silicon-germanium layers with respect to the silicon nano-sheets 17. The etching 101-7 is carried out in such a way as to remove a portion of each silicon-germanium layer 16, shown in FIG. 16, in such a way that each end of the silicon nano-sheets 17 is free.

An eighth substep 101-8 comprises forming second lateral spacers 7, shown in FIG. 17. The second lateral spacers 7, referred to as internal spacers, compensate the removal of the silicon-germanium from the silicon-germanium layers 16. They can be carried out in silicon nitride.

The step of providing also comprises forming the gate structure 2 by replacing the sacrificial gate 20.

For this, a ninth substep 101-9, shown in FIG. 18, consists of depositing a layer of dielectric material 22 in such a way as to cover the structure of FIG. 17. After mechanical and/or chemical polishing, the thickness of the layer of dielectric material 22 is uniform and reaches the top of the sacrificial gate 20. An upper surface of the sacrificial gate 20 is free.

A tenth substep 101-10, shown in FIG. 19, comprises the etching of the hard mask layer 19, of the sacrificial gate 20 with respect to the external spacers 6 in such a way as to form a cavity delimited by the external spacers 6.

Desirably, the forming of the gate structure 2 also comprises the replacing of the silicon-germanium layers 16 with a gate dielectric and a gate electrode 9. For this, the tenth substep 101-10 also comprises the etching of the silicon-germanium layers 16 selectively with respect to the internal spacers 7 and silicon nano-sheets 17. Thus, at the end of the etching 101-10, the silicon nano-sheets 17 are in suspension within a cavity delimited by the external and internal lateral spacers 6, 7.

The cavity formed at the end of the step 101-10 is filled during an eleventh substep 101-11 shown in FIG. 20. The step 101-11 comprising forming a gate dielectric and a gate electrode 9. The gate dielectric, the gate electrode 9 and the external and internal lateral spacers 6, 7 thus form the gate structure 2. The gate structure 2 can beneficially comprise:

- a gate dielectric made of dielectric material with a high dielectric constant, also called "high-k", such as a hafnium oxide, lining the surfaces of the cavity left by the removal of the sacrificial gate;
- a titanium nitride layer deposited on the high-k material layer;
- a tungsten gate electrode 9, entirely filling the cavity; and
- the external and internal lateral spacers 6, 7.

The gate structure 2 thus formed surrounds each nano-sheet 17 and desirably entirely surrounds a central portion of each nano-sheet 17. The layer of high-k material and the layer of titanium nitride can be deposited by atomic layer deposition (ALD).

At the end of this last substep 101-11, the base structure 1A such as implemented in the method for manufacturing 100, is complete. A partial and selective removal 101-12 of the dielectric material 22 is then carried out in order to release the base structure 1A.

The method for manufacturing 100 also applies to the manufacturing of so-called transistors with fins, also called FinFET for "Fin Field Effect Transistor". FIG. 21A to FIG. 24 show an embodiment of the steps of the method for manufacturing 100. This embodiment differs from the embodiment described hereinabove in that the step of providing 101 the base structure 1A provides a base structure comprising fins. FIG. 21A and FIG. 21B diagrammatically show an embodiment of the base structure 1A comprising fins. The implementation of the step of providing 101 that makes it possible to obtain a base structure 1A with fins is detailed in FIG. 29 to FIG. 39.

The fins are semiconductor layers belonging to the channel 3. In this embodiment, the channel 3 comprises two fins 31, 32, i.e. two semiconductor layers oriented vertically with respect to the surface of the substrate 1. The term fin means a layer having a width less than its thickness and its length. The thickness is measured perpendicularly to the surface of the substrate 1. The width is measured parallel to the substrate 1 and perpendicularly to the cutting plane N-N materialised in FIG. 21B. The length is measured parallel to the substrate 1 and to the cutting plane N-N.

The fins are desirably parallel to one another. Each semiconductor fin 31, 32 is surrounded by the gate structure 2. This base structure 1A allows for the manufacture of FinFET transistors with fins. Each fin 31, 32 comprises, at its ends, free surfaces that form the flanks 3a of the channel 3, and on which the silicon-germanium reservoir layer 10 will be deposited. FIG. 22 and FIG. 23 show the first and second intermediate structures 1B, 1C obtained at the end of the step 102 of growing the reservoir layer 10 on the flanks 3a of the channel 3 and of the step 103 of enriching the channel 3 from germanium atoms of the reservoir layer 10. The steps 102, 103 of growing and enriching of the second embodiment of the method for manufacturing 100 are desirably carried out with the same operating conditions as the first embodiment of the method 100, detailed hereinabove in reference to FIG. 3 to FIG. 6. Contrary to FIG. 3 to FIG. 6, the growing of the reservoir layer 10 is carried out in an extended manner and not only at the channel 3.

FIG. 24 shows the pFET transistor of the FinFET type obtained after etching of the reservoir layer 10 and forming 104 of the drain and source regions 121, 122 on either side of the channel 3. FIG. 24 shows more realistically the effect of the etching of the reservoir layer 10. Indeed, a portion of the channel 3 made from silicon-germanium can also be etched. However the etching is carried out in such a way that the channel 3 is always surrounded by the gate structure 2, its flanks remaining in line with the lateral spacers 6.

An alternative of the base structure 1A provided by the step of providing 101 is shown in FIG. 26A and FIG. 26B. This alternative comprises pads 22 arranged on either side of the channel 3 and of the gate structure 2. The pads 22 are shown along a cutting plane S-S in FIG. 26A, the cutting plane S-S being materialised in FIG. 26B. The pads 22 are positioned between each fin 31, 32. The pads 22 thus form barriers between the fins 31, 32 facilitating the formation of portions of the reservoir layer 10. The barriers formed limit the coalescence of the portions of reservoir layer 10 during their formation 102.

The pads 22 are beneficially deposited before delimiting the channel of the base structure. The structure, shown in FIG. 25A to FIG. 25D then comprises fins 21 extending beyond the gate structure 2. The pads 22 are deposited between each fin 21, such as shown in FIG. 25D. At the end of a step of delimiting described in reference to FIG. 38, the fins 21 are etched in order to obtain each channel 3. FIG. 26A and FIG. 26B diagrammatically show, according to two cutting planes S-S, N-N, a channel 3 and the pads 22. FIG. 25A moreover materialises as a dotted line a fin before delimiting the channel 3. The delimiting of the channel 3 can comprise an etching of the silicon not protected by the gate structure 2 that can also etch a portion of the pads 22.

FIG. 27 shows an example of a reservoir layer 10 coming from the step 102 comprising two portions, each portion being located between two pads 22, at a fin. Before the forming of the drain and source regions, the pads 22 can be removed. FIG. 28 shows an example of a doped SiGe layer 12 intended to form a drain or source region comprising two portions, each one of the portions being formed 104 at each portion of reservoir layer 10. The pads 22 having been removed beforehand, the portions of the doped SiGe layer 12 can coalesce. FIG. 28 shows, in the same way as FIG. 24, a portion of each reservoir layer 10 remaining after partial etching of these said layers 10.

A second embodiment of the step of providing 101, making it possible to obtain the base structure 1A shown in FIG. 21A and FIG. 21B, is shown by the flowchart of FIG. 29. The first and second embodiments of the step of providing 101 comprise common substeps that have the same reference signs in FIG. 9 and FIG. 29. The structures obtained at the end of each substep are shown in FIG. 30 to FIG. 41. The differences with respect to the first embodiment of the step of providing 101 are presented hereinafter.

According to this second embodiment, the substep 101-1 of the step of providing 101 comprises forming, on the substrate 1, a layer of silicon 17, such as shown in FIG. 30. Contrary to the first embodiment of the step of providing 101 (cf. FIG. 10), there is only a single layer of silicon deposited instead of a stack of layers.

The substep 101-2, shown in FIG. 31A and FIG. 31B comprises delimiting the active zone 21 of the future transistor. On the other hand, contrary to the first embodiment, the active zone 21 comprises at least one fin, such as shown as a top view in FIG. 31B.

The substep 101-3, shown in FIG. 32, comprises the surrounding of the fin 21 by means of a sacrificial material 18 whereon a hard mask layer 19 is then deposited.

The substep 101-4, shown in FIG. 33A and FIG. 33B, comprises the selective etching of the hard mask layer 19 and of the sacrificial material 18 in such a way as to form a sacrificial gate 20. The sacrificial gate 20 surrounds a region of the fin 21 of which a portion will form the channel of the final transistor.

The substep 101-5, shown in FIG. 34, comprises forming external lateral spacers 6 against the flanks of the sacrificial gate 20. Contrary to the first embodiment of the step of providing 101, this second embodiment only provides for the forming of the external lateral spacers 6, not forming internal spacers (reference sign 7 in FIG. 17 to FIG. 20).

The substep 101-9, shown in FIG. 35, also consists of depositing a layer of dielectric material 22 in such a way as to cover the structure of FIG. 34 in such a way that the thickness of the layer of dielectric material 22 is uniform and reaches the top of the sacrificial gate 20.

The substep 101-10, shown in FIG. 36, comprises the etching of the hard mask layer 19 and of the sacrificial gate 20 carried out selectively with respect to the lateral spacers 6 and to the fin 21. Thus, at the end of the substep 101-10 of etching, a portion of the fin 21 is exposed within a cavity delimited by the lateral spacers 6.

The cavity delimited by the lateral spacers 6 is filled during the substep 101-11, shown in FIG. 37, so as to form a gate dielectric (not shown in the figures) and a gate electrode 9. The gate dielectric, the gate electrode 9 and the lateral spacers 6 thus form the gate structure 2. The gate structure 2 thus formed surrounds a portion of the fin 21 which corresponds to the channel.

At the end of the substep 101-11 of filling, the substep 101-12 of selective removing of the second dielectric material 22, shown in FIG. 38, is carried out to release the gate structure 2 and the fin 21.

The first embodiment of the step of providing can beneficially comprise delimiting the channel before forming the definitive gate structure. Inversely, this second embodiment of the step of providing beneficially carries out delimiting the channel after the forming of the gate structure. For this, the substep 101-6 comprises the unidirectional etching, shown in FIG. 39, of a portion of the fin 21 that is not protected by the gate structure 2. The substep of unidirectional etching 101-6 thus makes it possible to form the channel 3, surrounded by the gate structure 2. The substep 101-6 of etching also makes it possible to release the flanks 3a of the channel 3, in line with each lateral spacer 6.

The base structure 1A obtained at the end of this last substep 101-6 is beneficially implemented in the manufacture of a transistor of the FinFET type.

This second embodiment of the step of providing beneficially comprises an additional substep 101-13, of forming pads 22, shown in FIG. 40. The pads 22 are formed on either side of the channel 3 and desirably from a low portion of the gate structure 2. The pads 22 are shown along a cutting plane S-S in FIG. 41. The pads 22 are desirably made of a dielectric material. The pads 22 are positioned between each ailette 31, 32. The height of the pads 22 from the substrate 1, i.e. perpendicularly to the substrate 1, is greater than or equal to the height of the channel 3 from the substrate 1.

The invention has particular interest in the cointegration of transistors of pFET and nFET types on the same substrate. The term cointegration means the manufacture of transistors of different types by the same method and on the same substrate.

FIG. 42 shows a flowchart of the implementation of a method of cointegrating 200 a transistor of the pFET type and a transistor of the nFET type on the same substrate. FIG. 43A to FIG. 51 diagrammatically show base structures and intermediate structures obtained at the end of the steps of the method of cointegrating 200. These figures in particular show the intermediate structures during the cointegrating of the four transistors, which is two transistors of the pFET type and two transistors of the nFET type.

A first step 201 of the method of cointegrating 200 comprises the providing 201 of base structures 1E', 1E" from which the pFET and nFET transistors will be carried out. Contrary to the step of providing for the carrying out of a single transistor, the step of providing 201 of the method of cointegrating 200 envisages at least one base structure 1E', 1E" for each type of transistor. In the examples shown in FIG. 43A and FIG. 43B, four identical base structures 1E', 1E" are provided. Two first base structures 1E' from which two pFET transistors will be carried out, and two second base structures 1E" from which two nFET transistors will be carried out. Each base structure 1E', 1E" comprises the characteristics described in reference to FIG. 2A and FIG. 2B, i.e.:

a silicon channel 3; and
a gate structure 2, surrounding the channel 3 leaving two flanks 3a free.

In this example, the base structures 1E', 1E" are beneficially intended to form GAAFET transistors because they comprise silicon nano-sheets 31, 32. The method of cointegrating 200 is also applicable to the manufacture of FinFET transistors, in which case it is beneficial to provide base structures 1E', 1E" such as described hereinabove in reference to FIG. 21A and FIG. 21B.

In order to carry out the following steps on the first base structures 1E', it is beneficial to carry out a step 202 of protecting second base structures 1E" by means of a first protective layer 13' entirely covering the second base structures 1E", as shown in FIG. 45. The first protective layer 13' can be solid wafer deposited, as shown in FIG. 44, in a first step then locally removed around first base structures 1E' in a second step in order to allow for the execution of the following steps. The first protective layer 13' can be a dielectric material such as silicon dioxide. An etching of the first protective layer 13' around first base structures 1E' makes it possible to manufacture pFET transistors without compromising the later carrying out of the nFET transistors.

The method of cointegrating 200 sequentially comprises, on each first base structure 1E', a step 203 of growing a first layer, a step 204 of enriching and a step 205 of forming drain and source regions, similar to the steps 102, 103, 104 of the method for manufacturing 100 described hereinabove in reference to FIG. 1 and FIG. 3 to FIG. 7. Thus, the operating parameters of the method for manufacturing 100 can be transposed to the steps 203, 204, 205.

FIG. 46 shows a first intermediate structure 1F' obtained at the end of the step 203 of growing during which a reservoir layer 10 made from silicon-germanium alloy grows on the flanks 3a of the channel 3 of each first base structure 1E'.

FIG. 47 shows a second intermediate structure 1G', obtained at the end of the step 204 of enriching the channel 3.

FIG. 48 shows two first transistors 1H' of the pFET type, obtained at the end of the step 205 of forming a first drain region and a first source region on either side of each silicon-germanium channel 3. In this example, the first two transistors 1H' produced comprise a common drain/source region 122/121.

In order to protect the first transistors 1H' of the pFET type during the realisation of the transistors of the nFET type, it is beneficial to carry out a step 206 of protecting first transistors 1H' by means of a second protective layer 13" deposited at said first transistors 1H' and in such a way as to cover them completely, such as shown in FIG. 49. The step 206 of producing first transistors 1H' beneficial leaves the second base structures 1E" free in such a way as to be able to carry out the following steps. For this, the step 206 of protecting first transistors 1H' beneficial comprises an etching of the first protective layer 13' located around second base structures 1E", shown in FIG. 49.

FIG. 50 shows second transistors 1I" obtained at the end of a step 207 of forming second drain 141 and source 142 regions on either side of each channel 3 of the second base structures 1E". The second drain and source regions 141, 142 are made of an n-doped semiconductor material, such as phosphorus-doped silicon. In this example, the two second transistors 1H" produced comprise a common drain/source region 142/141.

The cointegrating 200 of the transistors 1I', 1I" can beneficial be supplemented by a step 208, shown in FIG. 51, of forming metal electrodes 15. The metal electrodes 15 are deposited and connected to the first and second drain and source regions 121, 122, 141, 142. The metal electrodes 15 can be made from tungsten.

The invention claimed is:

1. A method for manufacturing a pFET transistor, the method comprising:
providing a base structure comprising a silicon channel and a gate structure, the gate structure comprising a gate electrode, a gate dielectric and lateral spacers, the gate dielectric separating the gate electrode from the channel, the lateral spacers being arranged on both sides of the gate structure, the gate structure surrounding the channel leaving two flanks of the channel free;
after said providing, growing a first silicon-germanium alloy layer on the flanks of the channel;
enriching the channel with germanium atoms from the first silicon-germanium alloy layer; and
forming a drain region and a source region on either side of the channel.

2. The method for manufacturing a pFET transistor according to claim 1, wherein the channel of the base structure comprises at least one silicon nano-sheet or at least one silicon nano-wire or at least one silicon fin.

3. The method for manufacturing a pFET transistor according to claim 1, wherein the channel of the base structure comprises a plurality of silicon fins parallel to one another and wherein the base structure comprises pads made of dielectric material arranged on either side of the channel between each silicon fin.

4. The method for manufacturing a pFET transistor according to claim 3, comprising the removal of pads after the enriching of the channel.

5. The method for manufacturing a pFET transistor according to claim 2, wherein the growth of the first silicon-germanium alloy layer is initiated from flanks of each silicon nano-sheet or from flanks of each silicon nano-wire or from flanks of each silicon fin.

6. The method for manufacturing a pFET transistor according to claim 1, wherein the enriching is carried out by application of a diffusion anneal configured to diffuse germanium atoms from the first silicon-germanium alloy layer in the channel.

7. The method for manufacturing a pFET transistor according to claim 1, wherein the enriching is carried out via oxidation of the first silicon-germanium alloy layer configured to condense germanium atoms from the first silicon-germanium alloy layer in the channel.

8. The method for manufacturing a pFET transistor according to claim 1, wherein the forming of the drain and source regions is carried out by the forming of a second layer on the first silicon-germanium alloy layer on either side of the channel, the forming of the second layer being configured to apply a compressive stress on the channel.

9. The method for manufacturing a pFET transistor according to claim 1, wherein the providing of the base structure comprises:
forming, on a substrate, an active zone, a sacrificial gate on a portion of the active zone and first lateral spacers on either side of the sacrificial gate;
delimiting the channel from the active zone by forming the free flanks of the channel in line with the first lateral spacers, and
forming the gate structure by replacing the sacrificial gate.

10. The method for manufacturing a pFET transistor according to claim 9, wherein the active zone comprises a stack of layers comprising at least one silicon-germanium layer and at least one silicon layer in alternation, the stack of layers starting, from the substrate, with a silicon-germanium layer.

11. The method for manufacturing a pFET transistor according to claim 10, wherein the forming of the gate structure comprises a replacing of said at least one silicon-germanium layer with a gate dielectric and a gate electrode.

12. A method for cointegrating a first pFET transistor and a second nFET transistor, the method comprising the following steps:
providing a first base structure and a second base structure identical to the first base structure, each base structure of the first base structure and the second base structure comprising a silicon channel, a gate structure and lateral spacers, the gate structure comprising a gate electrode, a gate dielectric and lateral spacers, the gate dielectric separating the gate electrode from the channel, the lateral spacers being arranged on both sides of the gate structure, the gate structure surrounding the channel leaving two flanks of the channel free;
after said providing, on the first base structure:
growing a first layer made from silicon-germanium alloy on the flanks of the channel;
enriching the channel with germanium atoms from the first layer made from silicon-germanium alloy;
forming a first drain region and a first source region on either side of the channel; and
on the second base structure, forming a second drain region and a second source region on either side of the channel of the second base structure.

13. The method for cointegrating a first pFET transistor and a second nFET transistor according to claim 12, comprising, before the step of growing applied to the first base structure, protecting the second base structure by means of a first protective layer.

14. The method for cointegrating a first pFET transistor and a second nFET transistor according to claim 13, comprising, before the step of forming applied to the second base structure, releasing the second base structure by removing the first protective layer.

15. The method for cointegrating a first pFET transistor and a second nFET transistor according to claim 12, comprising, before the step of forming applied to the second base structure, protecting the first pFET transistor by means of a second protective layer.

* * * * *